United States Patent
Tanabe et al.

(10) Patent No.: US 6,735,230 B1
(45) Date of Patent: May 11, 2004

(54) SEMICONDUCTOR LUMINOUS ELEMENTS AND SEMICONDUCTOR LASER

(75) Inventors: Tetsuhiro Tanabe, Kyoto (JP); Ken Nakahara, Kyoto (JP)

(73) Assignee: Rohm, Co., Ltd, Kyoto (JP)

( * ) Notice: Subject to any disclaimer, the term of this patent is extended or adjusted under 35 U.S.C. 154(b) by 0 days.

(21) Appl. No.: 09/786,337

(22) PCT Filed: Sep. 9, 1999

(86) PCT No.: PCT/JP99/04904

§ 371 (c)(1),
(2), (4) Date: Mar. 8, 2001

(87) PCT Pub. No.: WO00/16455

PCT Pub. Date: Mar. 23, 2000

(30) Foreign Application Priority Data

| Sep. 10, 1998 | (JP) | 10-257165 |
|---|---|---|
| Sep. 10, 1998 | (JP) | 10-257166 |
| Sep. 21, 1998 | (JP) | 10-266867 |
| Sep. 21, 1998 | (JP) | 10-266868 |
| Sep. 22, 1998 | (JP) | 10-268714 |
| Sep. 24, 1998 | (JP) | 10-270385 |
| Sep. 24, 1998 | (JP) | 10-270386 |
| Sep. 25, 1998 | (JP) | 10-271263 |
| Sep. 28, 1998 | (JP) | 10-274025 |
| Nov. 18, 1998 | (JP) | 10-328270 |

(51) Int. Cl.$^7$ .................................. H01S 3/19
(52) U.S. Cl. .................. 372/43; 372/45; 372/46
(58) Field of Search ................ 372/43, 44, 46, 372/48

(56) References Cited

U.S. PATENT DOCUMENTS

| 5,042,042 A | * | 8/1991 | Hori et al. ............ 372/32 |
| 5,987,048 A | * | 11/1999 | Ishikawa et al. ...... 372/46 |
| 5,998,232 A | * | 12/1999 | Maruska ................. 438/46 |
| 6,015,979 A | * | 1/2000 | Sugiura et al. ........ 257/86 |
| 6,274,891 B1 | * | 8/2001 | Tanaka et al. ........ 257/99 |

* cited by examiner

*Primary Examiner*—Paul Ip
*Assistant Examiner*—Dung T Nguyen
(74) *Attorney, Agent, or Firm*—Arent Fox Kintner Plotkin & Kahn, PLLC

(57) ABSTRACT

On the surface of a conductive substrate (1) of GaAs, Ge, Si, etc., a semiconductor lamination section including a light emitting layer forming portion (11) that has at least an n-type layer (4) and a p-type layer (6) made from a compound semiconductor of a Group III element and nitrogen and that is laminated so as to form a light emitting layer is formed through a buffer layer (2) suitable for the substrate. As a result, a semiconductor light emitting device using a Group III nitride compound semiconductor, which is of a vertical type that allows electrodes to be taken out from both of the upper and lower surfaces of a chip, has superior crystalline properties with high light emitting efficiency, and exhibits cleavage, is obtained. Therefore, it is possible to easily mount a LD chip on a sub-mount having a good thermal conductivity, and consequently to prevent a reduction and degradation in the light emitting efficiency (differential quantum efficiency) due to heat.

2 Claims, 14 Drawing Sheets

(a)

(b)

(a)

(b)

(c)

(d)

(e)

(a)

(b)

(c)

(a)

(b)

(a)

(b)

SEMICONDUCTOR LUMINOUS ELEMENTS AND SEMICONDUCTOR LASER

FIELD OF THE INVENTION

The present invention relates to a semiconductor light emitting device, such as a semiconductor laser and a light emitting diode, which uses a compound of a Group III element and nitrogen (a Group III nitride type, gallium nitride type compound semiconductor) and is capable of emitting light in the blue area that is required for an optical disk memory having a high storage density and for a high-precision laser beam printer. More specifically, the present invention concerns a semiconductor light emitting device in which a conductive substrate is used as a substrate on which a semiconductor layer having a superior light emitting property is laminated, and electrodes can be taken out from both of the upper and lower surfaces of a chip and is allowed to have a cleavage, and also concerns a semiconductor laser on which such a semiconductor light emitting device and its chip is mounted with a superior heat radiating property.

BACKGROUND OF THE INVENTION

With respect to blue-type semiconductor lasers, for example, Japanese Journal of Applied Physics (Jpn. J. Apply. Phys.) Vol. 35 (1996), pp 74–76, has reported a construction in which a CW oscillation is available in the blue area. As illustrated in FIG. 19, hexagonal system Group III nitride compound semiconductors are successively stacked on a sapphire substrate 71 by metal organic chemical vapor deposition (hereinafter, referred to as MOCVD); that is, the following layers are stacked: a GaN buffering layer 72, an n-type GaN layer 73, an n-type stress alleviating layer 74 made from $In_{0.1}Ga_{0.9}N$, an n-type clad layer 75 made from $Al_{0.12}Ga_{0.88}N$, an n-type light guide layer 76 made from GaN, an active layer 77 made of a multiple quantum well structure of an InGaN type compound semiconductor, a p-type light guide layer 78 made from p-type GaN, a p-type first clad layer 79 made from p-type $Al_{0.2}Ga_{0.8}N$, a p-type second clad layer 80 made from $Al_{0.12}Ga_{0.88}N$ and a contact layer 81 made from a p-type GaN. One portion of this semiconductor layers thus stacked is then etched by dry etching, etc. so that, as illustrated in FIG. 19, n-type GaN layer 73 is exposed to outside, and an n-side electrode 83 is formed on the surface thereof, and a p-type electrode 82 is formed on the aforementioned contact layer 81 respectively.

Moreover, Japanese Patent Notifying Publication No. 8217/1996 (Tokukouhei 8-8217) discloses a method in which a $Ga_aAl_{1-a}N$ ($0<a\leq 1$) serving as a buffering layer is formed, and a gallium nitride type compound semiconductor is stacked thereon.

However, in any of these methods, since the semiconductor layers are stacked on the sapphire substrate, the n-side electrode has to be formed on the n-type layer that has been exposed by etching one portion of the stacked semiconductor layers. Moreover, since the sapphire substrate is very hard, it is very difficult to provide a cleavage; therefore, the laminated layers of the Group III nitride compound semiconductor are again etched by dry etching to form an end face constituting a light resonator.

In the conventional blue-type semiconductor light emitting device, since a sapphire substrate is used as the substrate, it is not possible to form a vertical type element (referred to as a construction in which electrodes are formed on both of the upper and lower surfaces, and hereinafter, the same is true) having electrodes formed on both of the upper and lower faces of the laminated layer. For this reason, complex manufacturing processes are required, a complex chip bonding process is also required, and it is not possible to provide a cleavage, resulting in a failure in forming a flat end face from the atomic point of view.

Moreover, Patent Publication No. 2677221 discloses a method for laminating a Group III nitride compound semiconductor on a gallium arsenide substrate. In this method, a buffer layer of GaN, etc. is formed at a low temperature of approximately 350 to 530° C. by using a hydride vapor-phase epitaxial method, and a semiconductor laminated portion is then allowed to grow. However, in this method gallium nitride type compound semiconductor such as GaN is directly formed on a GaAs substrate, with the result that in comparison with a GaAs lattice constant of 5.6537 Å, cubic GaN has a lattice constant of approximately 4.5 Å, which is a greatly different value. For this reason, a highly unconformity hetero-epitaxial growth takes place, frequently resulting in a defective stacked layer; therefore, it is difficult to reduce the transition density to an extent necessary to emit laser light, and from the viewpoint of crystalline property, this method is more difficult than the method for laminating a gallium nitride type compound semiconductor layer on a sapphire substrate.

Moreover, another structure has been known in which a gallium nitride type compound semiconductor is stacked on a silicon carbide substrate with an AlN or GaAlN type semiconductor layer being provided as a buffer layer. However, in this structure also, in the same manner as the case where the lamination is made on the sapphire substrate, a hexagonal system gallium nitride type compound semiconductor is laminated at a high temperature, and a hexagonal-system-use silicon carbide substrate is adopted. Therefore, a substrate that is by far more expensive substrate than a sapphire substrate has to be used, and the substrate costs virtually 20 times as expensive as the sapphire substrate, resulting in a failure in putting this method into practical use.

As described above, the conventional blue-color semiconductor laser has the structure in which a Group III nitride compound semiconductor layer is laminated on a sapphire substrate, and sapphire has a thermal conductivity of 0.46 W/(cm·K), which is extremely smaller than that of Si (thermal conductivity 1.7 W/(cm·K)), etc. In the blue color semiconductor laser, since its wavelength is particularly short and since the Group III nitride compound semiconductor layer is inferior in the crystalline property, and tends to generate heat, its heat radiating efficiency gives greatly influences on the property and reliability of the semiconductor laser, as described earlier. For this reason, as shown in Japanese Unexamined Patent Application No. 235729/1995 (Tokukaihei 7-235729) as well as in FIG. 20, an upper p-side electrode 82 close to the active layer is die-bonded through a bonding agent 92 such as solder so as to directly contact a sub-mount 90, with the chip facing down. In this case, as described earlier, the n-side electrode 83 is formed in a concave section, and there is a step difference between the p-side electrode 82 and the n-side electrode 83; therefore, the die-bonding has to be carried out with solder agent 91 corresponding to the thickness being interpolated in between, or as illustrated in FIG. 21, a step difference is formed on the surface of the sub-mount 90, and the bonding is carried out with the step difference of the LD chip 70 being coincident with this step difference.

As described above, in the blue color LD chip using the conventional Group III nitride compound semiconductor, the Group III nitride compound semiconductor is laminated on the sapphire substrate; therefore, in order to carry out a mounting process so as to increase the heat-radiating efficiency, the die-bonding has to be carried out with thick solder agent 91 being interpolated on the side of the concave n-side electrode 83, or the mounting has to be carried out with the step difference of the LD chip 70 being coincident with the step difference formed on the surface of the sub-mount 90. However, in the case of the thick solder agent 91, it is highly possible that, when the solder agent 91 is fused, solder flows onto the laminated semiconductor layer (on the side wall exposed by etching), causing short-circuiting between the laminated n-type layer and the p-type layer or causing much current leakage. Moreover, in the case when the step difference is formed on the sub-mount, the step difference has a width of approximately several μm, and since there are some deviations, it is difficult to supply a large number of sub-mounts having a step difference coincident with the step difference of the LD chip, and to mass-produce a semiconductor laser with high yield. Furthermore, since a LD chip is smaller than 1 square mm, the gap between the two electrodes on the p-side and n-side that are placed on the same face side is also very small, frequently resulting in a problem of short-circuiting between the electrodes.

One objective of the present invention is to provide a semiconductor light emitting device at low costs, which is of a vertical type that allows electrodes to be taken out from both of the upper and lower surfaces of a chip, has a superior crystalline property in the semiconductor layer with a high light emitting efficiency, and uses a Group III nitride compound semiconductor.

Another objective of the present invention is to provide a semiconductor laser which can form a light emitting face by utilizing a cleavage so that an end face that is superior in flatness is obtained.

Still another objective of the present invention is to provide a semiconductor laser which has a vertical type chip that allows electrodes to be taken out from both of the upper and lower surfaces thereof, while using a Group III nitride compound semiconductor, and which is bonded to a sub-mount with high reliability, and efficiently radiates heat to the sub-mount.

Still another objective of the present invention is to provide a semiconductor laser having a structure in which the sub-mount can radiate heat more efficiently, and both of the electrodes of the chip can be easily electrically connected to a device side such as a stem through the sub-mount.

Still another objective of the present invention is to provide a semiconductor laser having a structure in which: an insulating sub-mount having a superior thermal conductivity is used and the respective electrodes of the LD chip are easily connected to a heat sink such as a stem without being embedded in a metal rod.

Still another objective of the present invention is to provide a semiconductor light emitting device such as an LD and its manufacturing method, which reduces the threshold current of a semiconductor light emitting device using a Group III nitride compound semiconductor so that the quantum differential efficiency is improved, a higher output is obtained by using a low operational voltage, and a light emission having a wavelength longer than that of blue light is available.

The other objective of the present invention is to provide a semiconductor laser which can reduce the threshold current of the laser and improve the output characteristic so that an appropriate current constriction layer is formed in a GaN type compound semiconductor layer.

DISCLOSURE OF THE INVENTION

In this case, the compound semiconductor of a Group III element and nitrogen refers to a semiconductor made from a compound between Ga that is a Group III element and N that is a Group V element or a compound in which one portion or all the portion of Ga that is a Group III element is substituted by another Group III element such as Al and In, and/or a compound in which one portion of N that is a Group V element is substituted by another Group V element such as P and As. This is also referred to as a Group III nitride compound semiconductor or a gallium nitride type compound semiconductor.

For example, the buffer layer is formed as a layer made from $GaN_xAs_{1-x}$ (0<x<1), or it is allowed to have a composition of gallium arsenide or a composition close to that of gallium arsenide on the substrate side, and also allowed to have a composition of the semiconductor layer that forms the lowermost layer of the semiconductor lamination section or a composition close to that of the semiconductor layer on the semiconductor lamination section side. Here, in the case when the semiconductor lamination section is made from a Group III element nitride compound, not limited by the composition of the lowermost layer of the semiconductor lamination section, for example, even when it is allowed to have a composition of GaN or a composition close to GaN, the problem of the lattice constant unconformity will not particularly arise. Here, for example, the composition closer to GaN refers to a compound in which a slight portion of Ga and/or N is substituted by another element.

In the case when the above-mentioned substrate is made from germanium, the buffer layer may be formed by $Al_zGa_{1-z}N$ (0≤z≤1).

In the case when the semiconductor lamination section has a structure in which it is sandwiched between an active layer and the n-type layer and p-type layer having greater band gap energy than the active layer, the light emitting efficiency is enhanced, and a high luminance light emitting diode or semiconductor laser is obtained.

A semiconductor laser is provided with a substrate made from a gallium arsenic compound, a buffer layer containing at least arsenic, nitrogen and gallium, formed on the substrate, and a semiconductor lamination section which is formed on the buffer layer, and is made of a compound semiconductor of a Group III element and nitrogen, with the active layer being sandwiched between the n-type layer and the p-type layer having a band-gap energy greater than the active layer, and the semiconductor lamination section is formed in such a manner that the refractive index of the active layer is set to be greater than the refractive index of each of the n-type layer and p-type layer.

In the case when the semiconductor lamination section is laminated so as to have a cubic crystal system and the light emitting face of the active layer is formed by a cleavage face, it is possible to form a resonator having an end face that is superior in the flatness, and consequently to obtain a semiconductor laser having a great output.

Specifically, this structure may be provided with a gallium arsenide substrate, a buffer layer that is placed on the substrate, and made from $GaN_xAs_{1-x}$ (0≤x≤1) with x varying successively, and a semiconductor lamination section having a first conductivity type clad layer formed on the buffer layer, a first conductivity type light guide layer, an active layer, a second conductivity type light guide layer and a second conductivity type clad layer. Here, the expression, x varying successively, refers to both of the cases in which it varies step by step and it varies successively.

More specifically, the structure may be further provided with a first electrode formed on the rear face of the gallium arsenide substrate, a contact layer formed on the semiconductor lamination section and a second electrode having a striped shape, formed on the contact layer.

A semiconductor light emitting device of the present invention is provided with a silicon substrate, a silicon carbide layer formed on the silicon substrate, and a semiconductor lamination section which is formed on the silicon carbide layer, made from a compound semiconductor of a Group III element and nitrogen, has at least an n-type layer and a p-type layer, and is laminated so as to form a light emitting layer.

In this structure, the semiconductor lamination section made of the compound semiconductor of the Group III element and nitrogen is formed on the silicon substrate through the silicon carbide layer; therefore, with respect to the lattice constant of silicon and silicon carbide, silicon has 5.43 Å, while the cubic crystal system of SiC has 4.36 Å, which is considerably different. However, by properly selecting the carbonizing state of the Si surface, it is possible to allow a single-crystal SiC to grow on the Si. The cubic single crystal SiC is formed so that the lattice unconformity does not develop so much, since SiC and GaN (lattice constant: approximately 4.5 Å) have lattice constants comparatively close to each other. Thus, it is possible to obtain a semiconductor light emitting device that is less susceptible to crystalline defects.

In particular, the above-mentioned silicon carbide layer is successively formed after the carbonizing process of the silicon substrate, with the result that the SiC layer is formed in the cubic crystal system, and the gallium nitride type compound semiconductor layer is also allowed to have a cubic crystal; thus, it is possible to easily laminate a semiconductor layer that is conformed to the Si substrate in the crystalline property. This method is based upon the idea that instead of the conventional idea that a gallium nitride type compound semiconductor needs to grow in the hexagonal crystal system, even a gallium nitride type compound semiconductor having the cubic crystal system is allowed to provide a high-efficiency light-emission if there is no crystalline defect.

Furthermore, the buffer layer made from a compound containing Ga and/or Al and N is interpolated between the silicon carbide layer and the semiconductor lamination section so that it is possible to absorb the lattice unconformity between the silicon carbide layer and the gallium nitride type compound semiconductor layer.

Additionally, in addition to $Al_zGa_{1-z}N$ ($0 \leq z \leq 1$), the compound containing Ga and/or Al and N may include another element to be added thereto as a substituent or a dopant.

In the case when the semiconductor lamination section has a structure in which it is sandwiched between an active layer and the n-type layer and p-type layer made of a material having greater band gap energy than the active layer, the light emitting efficiency is enhanced, and a high luminance light emitting diode or a high-output semiconductor laser is obtained.

A semiconductor laser is provided with a silicon substrate, a silicon carbide layer formed on the silicon substrate, and a semiconductor lamination section formed on the silicon carbide layer, and the semiconductor lamination section is made of a compound semiconductor of a Group III element and nitrogen, with the active layer being sandwiched between the n-type layer and the p-type layer having a band-gap energy greater than the active layer as well as having a refractive index smaller than the active layer.

A manufacturing method of a semiconductor laser in accordance with an embodiment of the invention is characterized by the steps of: (a) forming a semiconductor lamination section by laminating a compound semiconductor forming a light emitting layer forming portion on a first substrate having no cleavage, (b) applying a plasma generated from an inert gas on the surface of the semiconductor lamination section so as to expose the dangling bond to the surface, (c) affixing a second substrate having cleavage on the surface of the semiconductor lamination section to which the dangling bond is exposed, with the cleavage face of the second semiconductor substrate being coincident with the cleavage face of the semiconductor lamination section, (d) removing the first substrate and (e) allowing the second substrate to have cleavages to form chips.

Moreover, another method may be adopted in which the first substrate having no cleavage is removed without affixing the second substrate to the surface of the laminated semiconductor lamination section, and a plasma generated from an inert gas is applied to the exposed surface so that the dangling bond is exposed, and the second substrate is affixed to the resulting surface.

In the case when these methods are used, since the dangling bond is exposed to the surface of the semiconductor lamination section, the bonding process is made only by applying a low pressure onto the substrate without the need of any temperature rise, thereby making the semiconductor lamination section free from stress. Therefore, it is possible to obtain a semiconductor lamination section having superior crystalline properties, and consequently to obtain a semiconductor light emitting device with high efficiency. Moreover, since the bonding is made with the cleavage faces being coincident with each other, it is possible to obtain cleavage with ease.

It is preferable that further comprising the steps of: exhibiting a cleavage face by cleaving one portion of the semiconductor lamination section from which the first substrate has been removed, exhibiting a cleavage face by cleaving one portion of the second substrate to be bonded, and aligning the cleavage face of the semiconductor lamination section and the cleavage face of the second substrate so that the cleavage faces of the semiconductor lamination section and the second substrate are made coincident with each other; thus, it is possible to accurately match the two cleavage faces with each other.

The semiconductor lamination section, which has the hexagonal crystal system, is allowed to have its (11-20) face as the cleavage face, and the second substrate, which has the cubic crystal system, is allowed to have its (011) face as the cleavage face; and the two cleavage faces are made coincident with each other and bonded to each other so that the cleavage face of the semiconductor lamination section is matched with the cleavage face of the second substrate that has superior cleavage.

A semiconductor laser is provided with a laser chip that is bonded onto a sub-mount having a greater thermal conductivity, is characterized in that the laser chip is constituted by a conductive substrate and a Group III nitride compound semiconductor formed on the conductive substrate, and is provided with at least an active layer, a semiconductor lamination section having a first conductivity type clad layer and a second conductivity type clad layer sandwiching the active layer, a first electrode placed on the upper surface side of the semiconductor lamination section, a second electrode placed on the rear face of the conductive substrate, wherein the laser chip is bonded so that the first electrode comes into contact with the sub-mount.

In this structure, since the structure is of a vertical type that allows electrodes to be taken out from both of the upper and lower surfaces of the chip, it is not necessary to place one of the electrodes in a narrow place inside a concave section formed by etching. Therefore, it is possible to avoid an unwanted contact of a bonding agent to a side-face portion exposed by the etching or an unwanted contact between the electrodes. Moreover, since the upper electrode (first electrode) side close to the active layer that easily generates heat is bonded to the sub-mount, it is possible to efficiently radiate heat.

It is preferable to form the conductive substrate as one substrate selected from the group consisting of a GaAs substrate, an Si substrate having a SiC layer formed on its surface and a Ge substrate; thus, a Group III nitride compound semiconductor layer is laminated on the conductive substrate so that a chip of the vertical type that allows the electrodes to be taken out from the upper and lower surfaces is provided.

A semiconductor laser is provided with a laser chip that is bonded onto a sub-mount having a greater thermal conductivity, is characterized in that the laser chip is constituted by a substrate formed by placing a conductive SiC layer on the surface of Si and a Group III nitride compound semiconductor formed on the conductive substrate, and is provided with at least an active layer, a semiconductor lamination section having a first conductivity type clad layer and a second conductivity type clad layer sandwiching the active layer, a first electrode placed on the upper surface side of the semiconductor lamination section, a second electrode placed on the rear face of the conductive substrate, wherein the laser chip is bonded so that the second electrode comes into contact with the sub-mount.

With this structure, the laser chip has laminated layers in which the Group III nitride compound semiconductor layer is laminated on the silicon substrate having Si having a great thermal conductivity on its surface; therefore, it is possible to greatly improve the thermal conduction to the laser chip on the substrate side, and even if the substrate side is bonded in a manner so as to contact the sub-mount, heat generated in the active layer can be released sufficiently. As a result, the thickness of the substrate makes the distant from the surface of the sub-mount to the active layer greater, thereby virtually eliminating the possibility that the bonding agent on the sub-mount is raised to the active layer to cause unwanted short-circuiting.

The sub-mount having a great thermal conductivity is preferably formed by a material in which an insulation film made of AlN or SiC is formed on the surface of an Si substrate; thus, it is possible to efficiently radiate heat through the AlN or SiC having a high thermal conductivity formed on the surface.

The sub-mount having a high thermal conductivity is made from at least one material selected from the group consisting of AlN, SiC, diamond, c-BN and BeO, and has a metal rod that is embedded therein so as to provide conduction from the surface to the rear face of the sub-mount, with one of the electrodes of the laser chip being allowed to conduct to the rear face side of the sub-mount through the metal rod. Thus, it is possible to easily allow one of the electrodes to conduct to the rear face side of the sub-mount, while using the insulation substrate having a high thermal conductivity.

In a semiconductor laser a laser chip is die-bonded onto a sub-mount which is made of an insulation material or is partially made of an insulation material, and the sub-mount is placed on a heat sink section that is being provided with a step with the sub-mount being placed on the lower face on the step and wire bonding being provided between the upper face on the step and the sub-mount.

Here, the heat sink section refers to a base, formed by a metal, etc. that easily radiates heat from the sub-mount, on which the sub-mount of the semiconductor laser is installed.

With this arrangement, although one of the electrodes is not directly connected to the heat sink section electrically through the sub-mount, wire bonding is provided on the upper face of the heat sink section so that it stands virtually as high as the surface of the sub-mount. Therefore, it is not necessary to insert a wire-bonding capillary into a narrow space in the heat sink section, and the wire bonding can be carried out even in the narrow space.

When the sub-mount is made from AlN, SiC, or Si having a surface on which AlN or SiC is formed on the side without the semiconductor laser chip being die-bonded, it is possible to provide better thermal conduction, and consequently to radiate heat generated in the small semiconductor chip efficiently.

In the case when the semiconductor laser chip is made from a Group III nitride compound semiconductor, it tends to easily generate heat, and an insulation substrate having a great thermal conductivity is used as the sub-mount; therefore, the easiness of electrode connection is very effective.

A semiconductor laser includes a laser chip that is provided with a semiconductor lamination section that is made of a Group III nitride compound semiconductor placed on a substrate, and includes at least an active layer and a first conductivity type clad layer and a second conductivity type clad layer sandwiching the active layer, and at least one end face of the end faces constituting an optical resonator of the semiconductor laser chip is formed into a flat face. Moreover, an insulation film, provided as a single-layer film or a multi-layered film including a plurality of films having different refractive indexes, is formed on the surface of the flat face.

Here, the expression that "the end face is formed into a flat face" refers to a state in which irregularities in terms of atoms are not formed on a surface subjected to dry etching, and, for example, such a face includes an end face formed through cleavage and a chemically polished face after having been subjected to dry etching.

With this structure, since the insulation film is formed on the surface of the flat face, it is possible to eliminate irregular reflection caused by the interface to the insulation film, and reflected light is positively returned to the inside of the optical resonator, thereby making it possible to improve the differential quantum efficiency.

The end face serving as the light-releasing face of the optical resonator is controlled with a low reflection coefficient, while the opposite face is controlled with a high reflection coefficient so that most of light, generated only on one of the faces utilized is released; thus, the generated light is utilized very efficiently.

The above-mentioned insulation film with a high reflection coefficient is formed by a multi-layered film, and even number of layers are alternately laminated, each layer having a thickness of λ/4n (λ: light emission wavelength, n: refractive index of each insulation film), so that it is possible to increase the reflection coefficient. Moreover, with respect to a single layer film or a multi-layered film, odd number of layers are laminated, each layer having a thickness of λ/4n (λ: light emission wavelength, n: refractive index of each insulation film), or a single layer film or a multi-layered film is formed, each layer having a thickness of λ/2n, so that it is possible to reduce the reflection coefficient.

The substrate may be made from any one of Si, Ge, SiC and GaN, on the surface of which GaAs or SiC is formed, and the end face is formed into a flat face through cleavage; thus, it is possible to obtain a light reflection face like a mirror surface.

Here, in the case when the substrate and the Group III nitride compound semiconductor lamination section is made of the cubic crystal system, cleavage is provided more effectively, and a flatter end face is obtained.

A semiconductor laser in accordance with an embodiment of the present invention comprises, a substrate, and a semiconductor lamination section on the substrate, the semiconductor lamination section being made from a Group III nitride compound semiconductor and including at least an active layer and a first conductivity type clad layer and a second conductivity type clad layer sandwiching the active layer a current constriction layer being made from an insulation material, having a stripe-shaped opening section, and being provided inside the semiconductor lamination section.

With this structure, since the current constriction layer is placed close to the active layer, it is possible to inject a current into the light emitting region effectively, and consequently to simultaneously achieve a reduction in the threshold value and an increase in the quantum efficiency; therefore, it is possible to achieve a high output and high reliability.

The Group III nitride compound semiconductor layer is formed through the lateral growth on the current constriction layer via the stripe-shaped opening section of the current constriction layer so that the current constriction layer made from an insulation material is formed inside the semiconductor lamination section.

In this structure, the second conductivity type clad layer is formed on the upper layer side of the active layer and the current constriction layer is formed in the second conductivity type clad layer or thereon through an etching stop layer made from $Al_sGa_{1-s}N$ ($0<s\leq0.1$) in which GaN or Al composition is small; therefore, Al contained in the clad layers, which is susceptible to corrosion from etching liquid at the time of etching, is not exposed so that the Group III nitride composition semiconductor is allowed to preferably grow thereon without being damaged in its re-growth interface.

In the case when the current constriction layer is made from an oxide of Si or Al and/or a nitride, etching is easily carried out without giving influences on the semiconductor layer, and the current constriction layer having a stripe-shaped opening section is readily formed therein.

Light guide layers may be formed between the first and second conductivity type clad layers and the active layer respectively so as to form a waveguide path.

A manufacturing method of a semiconductor laser has the steps of (a) depositing a buffer layer on a substrate, (b) laminating a light emitting layer forming portion, made from a Group III nitride compound semiconductor formed on the buffer layer, which includes a first conductivity type clad layer, an active layer and a second conductivity type clad layer, (c) forming an insulation film on the light emitting layer forming portion, (d) forming a current constriction layer made from an insulation material having a stripe-shaped opening section by etching the insulation film in a stripe manner and (e) allowing a second conductivity type Group III nitride compound semiconductor to grow laterally on the current constriction layer with the semiconductor layer exposed to the stripe-shaped opening section of the current constriction layer serving as a seed.

Prior to forming the insulation film, the etching stop layer made of a Group III nitride compound semiconductor is allowed to grow, and the insulation film is etched by an acidic solution so that the stripe-shaped opening section is formed without giving influences on the semiconductor layer.

A semiconductor light emitting device is provided with an active layer, made from a Group III nitride compound semiconductor, for emitting light upon injection of a current, and n-type and p-type clad layers, made from a Group III nitride compound semiconductor having band gap energy greater than the active layer, which sandwich the active layer from the respective sides, is characterized in that the active layer is made of a compound semiconductor layer containing Ga, P and N.

The active layer may be formed by a material that is, for example, represented by $GaP_uN_{1-u}$ ($0<u<0.5$). Moreover, in the case when the active layer has a single quantum well structure or a multiple quantum well structure, it is allowed to emit light with high light-emission efficiency, thereby making it possible to provide a semiconductor laser with a high output.

When the substrate is composed of any one of Si on the surface of which GaAs or SiC is formed, Ge, SiC and:GaN, it is possible to provide chips through cleavage, thereby providing an effective structure in forming a semiconductor laser.

In this structure, a mixed crystal of Tl is obtained with superior crystalline property, and even in the case of light having a long wavelength with a low threshold value such as green light, it can be emitted sufficiently by using a direct transition-type semiconductor; thus, it becomes possible to provide a green light semiconductor laser.

The above-mentioned active layer may be formed by a material represented by a general formula, $Tl_vGa_{1-v}N$ ($0<v<1$). Moreover, in the case when the active layer has a quantum well structure, with the well layer of the quantum well structure being formed by a material represented by the general formula, $Tl_vGa_{1-v}N$ ($0<v<1$), it is allowed to emit light with high light-emission efficiency, thereby making it possible to provide a semiconductor laser with a high output.

A manufacturing method of a semiconductor light emitting device according to an embodiment of the present invention, which has the steps of forming a buffer layer on a substrate by using an MOCVD method, growing a semiconductor lamination section made from a Group III nitride compound semiconductor, containing an n-type layer, an active layer and a p-type electrode so as to be electrically connected with the n-type layer and the p-type layer respectively, wherein at the time of the growth of the active layer, a trivalent thallium compound is introduced as a reaction gas for Tl element sot that the active layer is allowed to grow by a compound semiconductor.

BEST MODES FOR CARRYING OUT THE INVENTION

Figure 1:
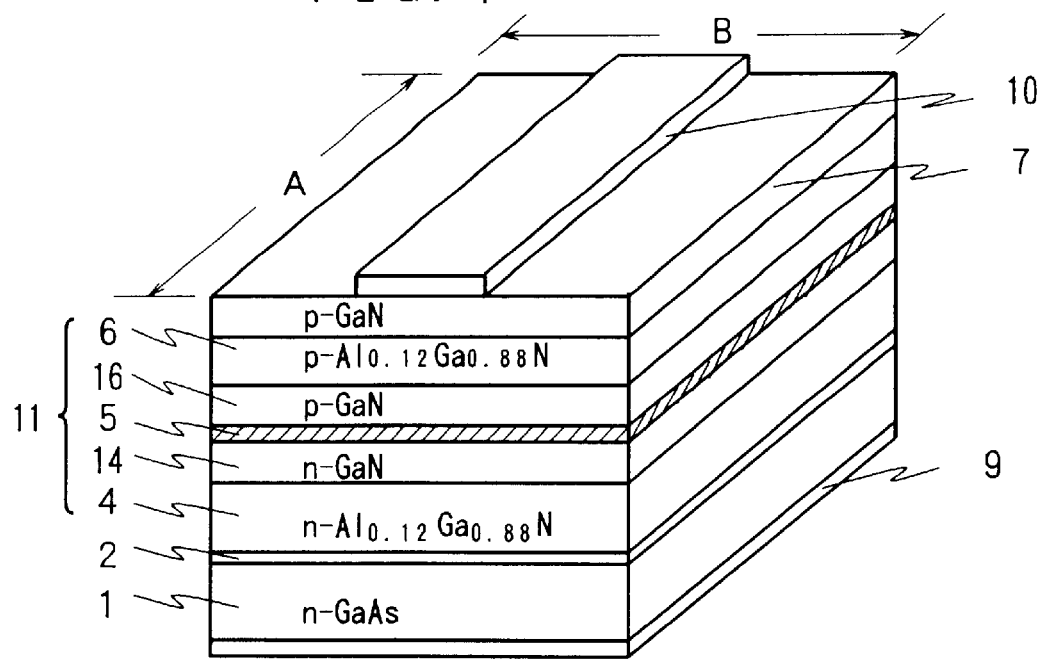
FIG. 1 is a perspective explanatory view showing a first embodiment in accordance with the present invention.

As illustrated in FIG. 1 which shows a perspective explanatory drawing of one example of a semiconductor laser chip, the semiconductor light emitting device of a first embodiment of the present invention is provided with a substrate 1 composed of a gallium arsenide compound (GaAs) and a buffer layer 2 containing at least arsenic, nitrogen and gallium, which is formed on the surface of the substrate 1. Moreover, on the buffer layer 2 is formed a light emitting layer forming portion 11 containing at least n-type layers 4, 14 and p-type layers 6, 16, composed of a compound semiconductor of a Group III element and nitrogen, which is laminated so as to form a light emitting layer.

With respect to the GaAs substrate 1, for example, such a substrate of n-type in which Si is doped is used. The buffer layer 2 is made from, for example, n-type $GaN_xAs_{1-x}$ (0<x<1) with a thickness of 0.01 to 0.1 μm, more preferably, 0.03 to 0.06 μm, for example, approximately 0.05 μm. In the case of a thickness out of this range, the surface homology will deteriorate.

Figure 2:
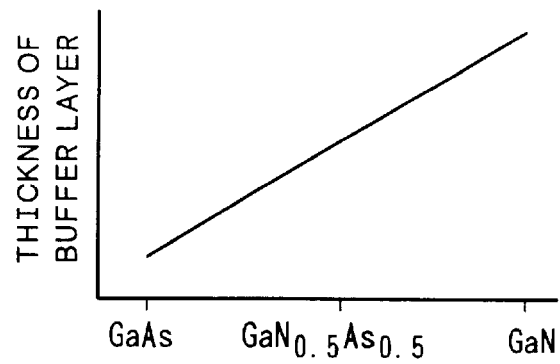
FIG. 2 is an explanatory drawing that shows the variation in composition of a buffer layer of FIG. 1.
Figure 2:
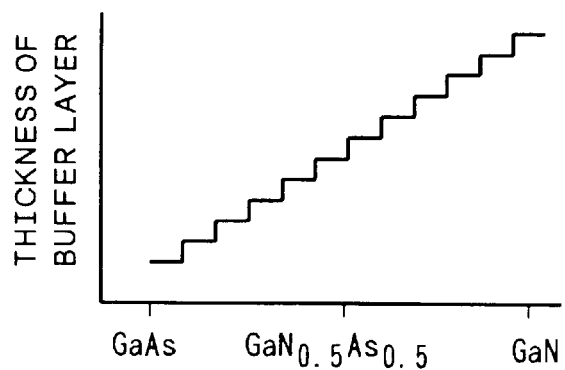

The buffer layer 2 may be allowed to grow, for example, as a layer with x being constant in $GaN_xAs_{1-x}$ (0<x<1), or may be allowed to grow with x being varied from 0 to 1 $GaN_xAs_{1-x}$ (0<x<1), as exemplified by the change in composition from the GaAs substrate 1 to the semiconductor lamination section 8 in FIG. 2(a), in which the growth is started with a composition of GaAs or that close to GaAs on the GaAs substrate 1 side, and the composition is changed gradually so as to become the composition of the lowermost layer of the semiconductor lamination section 8 or GaN, as the material gas of N is increased while the material gas of As is reduced. In order to change the composition in this manner, a mass flow controller (MFC) for controlling the supply of the material gases such as dimethyl hydrazine (DDMHy) and arsine ($ASH_3$) is successively changed so that the buffer layer 2 whose -composition successively varies as shown in FIG. 2(a) is formed. The change in the composition of the buffer layer 2 is not necessarily continuous as shown in FIG. 2(a), and may be changed in a stepped manner, as shown in FIG. 2(b). For example, even in the case when about ten steps are formed, since the total thickness is approximately 10 nm, each layer has a thickness of approximately 1 nm with the change taking place for approximately 2 seconds in the growth time; thus, the change is almost similar to the successive change. Moreover, in the case of a lamination structure having a thickness of approximately several nm, even when the lattice constants are different between the layers, no distortions are accumulated, causing no problem of the lattice unconformity. Here, as described above, even in the case of a constant layer with no changes in the composition of the buffer layer 2, since this layer has an intermediate composition between the GaAs substrate and the Group III element nitride, the lattice constant also has an intermediate value, thereby alleviating the lattice unconformity between the two layers.

Moreover, with respect to the composition of the buffer layer 2, not limited to $GaN_xAs_{1-x}$, those containing another Group III element such as Al and In or another Group V element such as P may be used. However, since the substrate is composed of GaAs and since the semiconductor lamination section 8 formed on the buffer layer is a GaN type compound semiconductor, it is preferable to use a layer containing Ga, As and N.

In the example as shown in FIG. 1, the light emitting layer forming portion 11 is formed by stacking the following layers: a clad layer 4 made from n-type $Al_yGa_{1-y}N$ (0.05≦y≦0.4, for example, y=0.12), having a thickness of 4 μm, a light guide layer 14, made from n-type GaN, having a thickness of 0.1 μm, an active layer 5 having a multiple quantum well structure having laminated layers of 3 to 4 barrier layers, each made from $In_{0.02}Ga_{0.98}N$, and 3 to 4 well layers, each made from $In_{0.15}Ga_{0.85}N$, with the total thickness of 10 to 2.0 nm, a light guide layer 16 made from p-type GaN having a thickness of approximately 0.1 μm and a clad layer 6 made from p-type $Al_yGa_{1-y}N$ (0.05≦y≦0.4, for example, y=0.12) having a thickness of 0.8 μm. Moreover, it is preferable to allow each of the light emitting layer forming portion 11 to grow to have cubic crystals; thus, since the GaAs substrate has cubic crystals, it is possible to provide superior crystalline property and cleavage.

The structure of the light emitting layer forming portion 11 and the materials of the respective layers are not intended to be limited by this example. Not limited to the quantum well structure, the active layer 5 may have a bulk double hetero-junction structure, as long as the active layer 5 is composed of a material having band gap energy smaller than that of the clad layers 4, 6. In the case of a semiconductor laser shown in FIG. 1, the active layer 5 is formed by a material whose refractive index is greater than that of the clad layers 4, 6. Thus, light can be confined in the active layer 5, and in the case when, although the active layer 5 is allowed to confine light, it fails to confine sufficiently because of the thinness of the active layer 5, the light guide layers 14, 16 having a refractive index that is intermediate between the clad layers 4, 6 and the active layer 5 are placed, as shown by the example of FIG. 1. However, if the active layer 5 confines light sufficiently, it is not necessary to place the light guide layers 14, 16. Moreover, the above-mentioned materials of the active layer 5 and the clad layers 4, 6 are only examples, and they can of course be altered depending on wavelengths, etc. of light to be emitted.

A contact layer 7 made from p-type GaN is placed on the light emitting layer forming portion 11. This is used for easily providing an ohmic contact to an electrode 10. On this contact layer 7, the stripe-shaped p-side electrode 10 with a width of approximately 10 μm is formed through an Ni/Al lamination structure, and on the entire rear face of the GaAs substrate 1, an n-side electrode 9 having the Ni/Au lamination structure is formed; thus, this is divided into chips, each having a size of, for example, 700 μm×500 μm in the longitudinal length (A)×lateral (B) length, thereby forming a semiconductor laser chip having a structure shown in FIG. 1. When this wafer is divided into chips, scratches are formed with intervals of 700 μm by using, for example, a diamond needle, in a direction perpendicular to the stripe direction of the p-side electrode 10, and this is allowed to exhibit cleavage by applying an impact thereto. With respect to a direction parallel to the stripe of the p-side electrode 10, a dicing operation is carried out by a dicer. As a result, the light-releasing face shown in the front view of FIG. 1 is formed into a flat mirror face.

Next, an explanation will be given of a manufacturing method of this semiconductor laser. For example, an epitaxial growth device, such as an MOCVD, is used, and while maintaining the substrate temperature at approximately 600° C., triethylgallium (TEG) serving as a material gas for a Group III element, arsine (ASH$_3$) serving as a material gas for a Group V element, dimethylhydrazine (DDMHy) and silane (SiH$_4$) serving as an n-type dopant are introduced thereto, thereby allowing a buffer layer 2 to grow. At this time, when the growth of the buffer layer 2 is made while the composition thereof is being changed as described above, the rate of flow of ASH$_3$ is successively reduced, with the rate of flow of DDMHy being successively increased. The growth results in a buffer layer 2 with cubic crystals on the GaAs substrate 1 with cubic crystals.

Next, with the substrate temperature being maintained at approximately 750° C., the material gases TEG and DDMHy, and trimethyl aluminum (TMA) serving as a material gas of Al are introduced thereto together with SiH$_4$ that is a dopant gas so that an n-type clad layer 4 made from n-type Al$_{0.12}$Ga$_{0.88}$N is allowed to grow with a thickness of approximately 4 μm. Successively, after the gas TMA has been stopped, an n-type light guide layer 14 made from n-type GaN is allowed to grow with a thickness of 0.1 μm. Moreover, after the material gas TMA and the dopant gas have been stopped, trimethyl indium (TMI) is introduced with its rate of flow being varied so as to allow an active layer 5 having a multiple quantum well structure to grow; thus, the active layer 5 has laminated layers of 3 to 4 barrier layers, each made from In$_{0.02}$Ga$_{0.98}$N, and 3 to 4 well layers, each made from In$_{0.15}$Ga$_{0.85}$N, with the total thickness of 10 to 20 nm. Next, with the material gases being set in the same manner as the n-type, cyclopentadienyl magnesium (Cp$_2$Mg) or dimethyl zinc (DMZn) is introduced as a p-type dopant, thereby allowing a p-type light guide layer 16 and a p-type clad layer 6 are successively allowed to grow; thus, a light emitting layer forming portion 11 is formed. Successively, in the same manner, a contact layer 7, made from p-type GaN is allowed to grow with a thickness of 0.8 μm. The light emitting layer forming portion 11 and the contact layer 7 are allowed to grow at a temperature of approximately 700 to 800° C. so that the respective semiconductor layers are laminated with cubic crystals, thereby making it possible to match them with the cubic crystals of the GaAs substrate 1, and consequently to laminate semiconductor layers having superior crystalline property. In other words, in the case of not less than 1000° C., hexagonal crystals tend to be formed, resulting in failure to obtain semiconductor crystals that are matched with the substrate 1. However, since the growth is made with cubic crystals, it is possible to form semiconductor layers that are properly matched with the substrate 1 and allowed to smoothly exhibit cleavage, which will be described later.

Thereafter, the substrate 1 on which the semiconductor layers have been laminated is taken out of the MOCVD device, and them subjected to an annealing process for approximately 20 minutes at approximately 700° C. in a nitrogen gas atmosphere so that the p-type layers such as the contact layer 7 that is the uppermost layer are subjected to a resistivity-reducing process. Then, the rear face of the GaAs substrate 1 is ground through grinding and polishing to be made thinner to approximately 80 μm, and Ni and Au are formed on the entire rear surface of the substrate 1 by vacuum vapor deposition, etc. so as to have a thickness of 0.1 to 1.5 μm respectively; thus, an n-side electrode 9 is formed. Further, Ni and Al are formed on the contact layer 7 on the surface of the laminated semiconductor layers by using a lift-off method in the same manner so as to have a thickness of 0.1 to 1.5 μm respectively; so that stripe-shaped p-side electrodes 10 having a width of approximately 10 82 m with intervals of 500 μm, as illustrated in FIG. 1. Then, scratches are formed thereon by using a diamond needle in a direction perpendicular to the stripe direction of the p-side electrodes 10 with intervals of 700 μm. This is then allowed to exhibit cleavage by giving an impact thereto, and the wafer is diced in a direction parallel to the p-side electrodes 10, thereby dividing into chips as illustrated in FIG. 1.

In the semiconductor light emitting device of the first embodiment, since the compound semiconductor layer containing Ga, As and N that connects to the Group III nitride compound semiconductor starting with GaAs is formed as a buffer layer, while using GaAs as the substrate, it is possible to avoid the lattice unconformity between the substrate and the semiconductor lamination section, and consequently to laminate Group III nitride compound semiconductor layers having superior crystalline property. As a result, a blue-color (from ultraviolet to yellow, etc.) semiconductor light emitting device using a GaAs substrate is obtained with high light emitting efficiency.

Moreover, since the GaAs substrate is used, the p-side electrode and n-side electrode can be taken out respectively from the upper and lower sides of the chip; therefore, it is not necessary, for example, to remove one portion of the laminated semiconductor layers by etching, etc. so as to form the n-side electrode, as has been carried out in conventional methods. Therefore, it becomes possible to simplify the manufacturing processes, and upon application, one of the electrodes can be electrically connected to a lead wire simply by using die bonding; thus, it is possible to reduce the number of wire bonding processes.

Moreover, the semiconductor layers having cubic crystals are laminated on the GaAs substrate so that the structures from the substrate to the semiconductor lamination section are aligned by the cubic crystals so that it is possible to provide superior cleavage, and in particular, in the case when a laser element is manufactured, a resonator having an end face having superior flatness is obtained, and a semiconductor laser having a superior oscillation property is thus obtained.

In this embodiment, the semiconductor laser has an electrode stripe structure in which the p-side electrode is made to have a stripe shape; however, other structures such as a mesa-stripe structure in which semiconductor layers on both of the sides of the striped electrode are etched to the upper portion of the p-type clad layer in a mesa-shape or a proton injecting type in which protons, etc. are injected thereto, may be adopted. Moreover, a refractive index wave-guide type structure in which a current regulating layer is embedded therein may be adopted.

Moreover, in the above-mentioned example, a semiconductor laser has been discussed; however, with respect to light emitting diodes (LEDs), a vertical-type LED chip which allows the electrodes to be taken out from the upper and lower faces of the chip is obtained. Therefore, it is possible to improve the easiness in handling, and also to eliminate the necessity of etching used for connecting the electrodes. Moreover, it is possible to easily divide from a wafer to respective chips, and consequently to simplify the manufacturing processes. In this case, in LEDs, it is not necessary to form a light wave-guide path, and no light guide layer is required, and the active layer is preferably made to have the double hetero-junction or single quantum well structure. Moreover, in the case of LEDs, not limited to the double hetero-junction structure, the pn-junction structure may be adopted. Furthermore, in most cases, a structure for taking light out from the upper face is adopted, and this structure needs a smaller electrode on the surface side; therefore, it is preferable to form a transparent p-side electrode which easily diffuses a current and allows light to transmit by using, for example, ITO.

In accordance with the first embodiment, a vertical-type blue-color semiconductor light emitting device having electrodes on both upper and lower faces are obtained; therefore, it is possible to simplify the manufacturing processes, and consequently to cut costs, and upon application, the number of wire bonding processes can be reduced so that it is possible to obtain an easy-to-use semiconductor light emitting device at low costs.

Moreover, since it is possible to provide cleavage, a laser resonator having a superior end face can be obtained, and a semiconductor laser having high performances with a short wavelength, which can be used for an optical disk memory having a high storage density and a high-precision laser beam printer, can be obtained.

Figure 3:
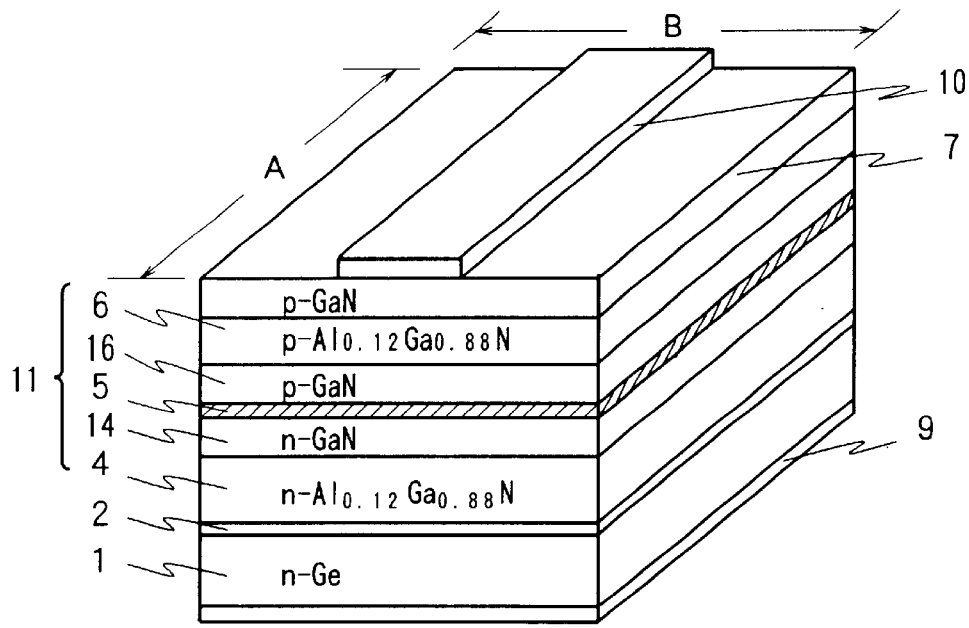
FIG. 3 is a perspective explanatory view showing a modified example of FIG. 1.

In the above-mentioned first embodiment, a GaAs substrate is used as the substrate; and from the viewpoint of lattice constant, etc., germanium (lattice constant: 5,6575 Å) has crystalline property very close to that of GaAs (lattice constant: 5.6537 Å). For this reason, instead of the GaAs substrate 1, a germanium substrate 1 may be used, and as illustrated in FIG. 3, a LD chip having the same structure is manufactured. As a result, a GaN type compound semiconductor layer having superior crystalline property is obtained in the same manner. In the structure of FIG. 3, a buffer layer 2 containing at least arsenic, nitrogen and gallium is formed on the surface of a substrate 1 made from germanium (Ge). Moreover, a light emitting layer forming portion 11, which has at least n-type layers 4, 14 and p-type layers 16, 6, made of a compound semiconductor of a Group III element and nitrogen, and is laminated so as to form a light emitting layer, is formed on the buffer layer 2.

With respect to the Ge substrate 1, a material of n-type to which, for example, phosphor (P) is doped is used. The buffer layer 2 is provided to have the same structure as the above-mentioned example, and the other structures such as a semiconductor lamination section, may be formed to have the same structure. Therefore, those members having the same functions are indicated by the same reference numbers, and the description thereof is omitted. However, in the case when Ge is used as the substrate, the composition of the buffer layer 2 is not limited to $GaN_xAs_{1-x}$, and another Group III element such as Al or In and a material containing other Group V element such as P may be used. Moreover, when the film-forming process is carried out at a low temperature, even in the case of $Al_zGa_{1-z}N$ ($0 \leq z \leq 1$) used as the buffer layer as in the case of formation on a sapphire substrate, it is possible to allow a Group III nitride compound semiconductor with cubic crystals to grow thereon. Here, since the substrate is Ge and since the light emitting layer forming portion 11 laminated on the buffer layer is a compound semiconductor of GaN type, it is preferable to use a layer containing Ga and As and N of GaAs that has a lattice constant, etc. close to Ge.

Figure 4:
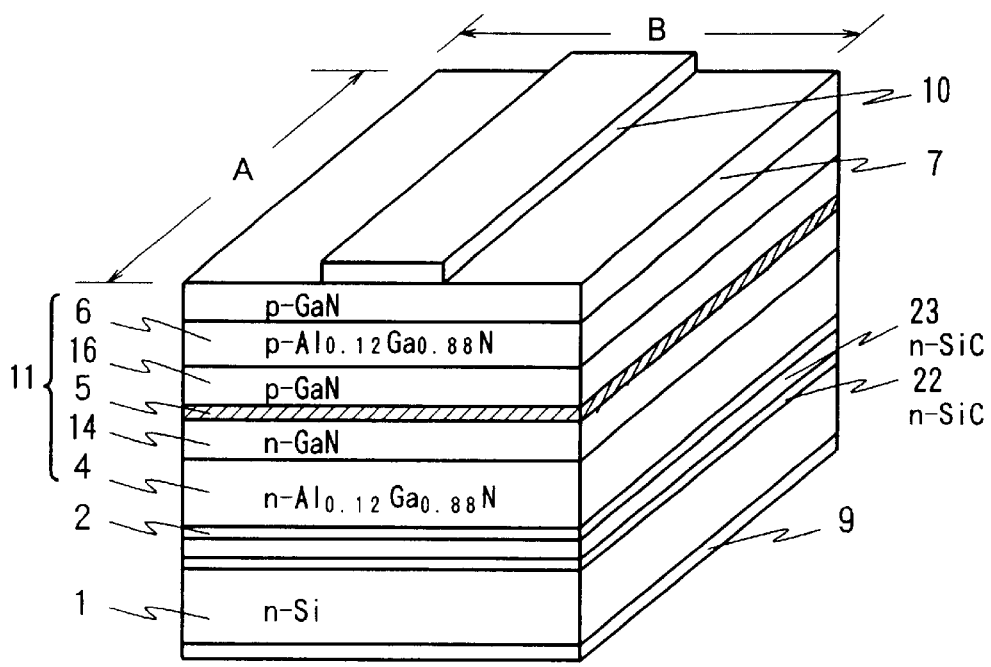
FIG. 4 is a perspective explanatory view showing a second embodiment in accordance with the present invention.

As illustrated in FIG. 4 which shows a perspective explanatory drawing of one example of an LD, the semiconductor light emitting device of a second embodiment of the present invention is provided with a silicon carbide layer 23 formed on a silicon substrate 1, and on the silicon carbide layer 23 is formed a light emitting layer forming portion 11 containing at least n-type layers 4, 14 and p-type layers 16, 6, composed of a compound semiconductor of a Group III element and nitrogen, which is laminated so as to form a light emitting layer.

As described earlier, conventionally, the lamination of the gallium nitride type compound semiconductors has been carried out in the hexagonal crystal system; however, the inventors of the present invention have studied hard and found that in the case when the growth is made in the cubic crystal system, it is also possible to obtain a light emitting diode with high luminance and a laser diode with a high output by laminating semiconductor layers having less defects in crystals. Thus, an SiC layer which has an affinity for Si is formed on an Si substrate, and on this is allowed to grow a gallium nitride type compound semiconductor in the cubic crystal system, so that it becomes possible to obtain a semiconductor lamination section that is less susceptible to defects in the crystal, and consequently to realize the present invention.

An Si substrate 1 is normally used in ICs, and an SiC film 22 is formed on the surface thereof with a thickness of approximately 100 Å through a carbonizing process, and on this is formed an SiC layer 23 with a thickness of approximately 2 μm. The SiC film 22 formed through the carbonizing process is used for allowing the SiC layer 23 to easily grow together with the crystal of the Si substrate 1, and the SiC film 22 is formed along the crystal of the Si substrate 1 through the carbonizing process. This growth of the SiC layer 23 with the crystals of the SiC film 22 serving as seeds also takes place along the crystal of Si in the cubic crystal system. The SiC film 22 formed through the carbonizing process is placed so that the crystals of Si and the crystals of SiC are allowed to conform to each other, and the thickness thereof is sufficiently set to the above-mentioned 100 Å; here, even if the carbonizing process is carried out for a long time, the carbonization does not progress inside thereof. Moreover, the SiC layer 23 is a layer serving as a base on which a GaN type compound semiconductor layer is laminated while maintaining the conformity with the Si substrate 1; therefore, this layer needs to allow the GaN type compound semiconductor, to grow stably, and is set to have a thickness of approximately 0.5 to 5 μm, more preferably, 1 to 3 μm.

A buffer layer 2, made from, for example, $Al_{0.1}Ga_{0.9}N$, is formed on the SiC layer 23 with a thickness of approximately 0.1 μm at a temperature of as low as 600° C. The difference in the lattice constants between the SiC layer 23 and the light emitting layer forming portion 11 is comparatively small, but it still accounts for approximately 3.5% with respect to GaN, and the above-mentioned layer is used for alleviating the lattice unconformity caused by the difference. With respect to this buffer layer 2, $Al_zGa_{1-z}N$ ($0 \leq z \leq 1$) or a material formed by adding an other element to this or substituting this with another element may be used. The buffer layer 2 is sufficiently set to have a thickness of approximately 0.01 to 0.2 μm.

The structures of the light emitting layer forming portion 11 and the contact layer 7 are the same as those described in the aforementioned example; and the description thereof is omitted. In this example, the p-side electrode 10 is formed with an Ni/Al lamination structure, and the n-side electrode 11 formed with an Ni/Au lamination structure is formed on the entire rear face of the GaAs substrate 1. Moreover, in this example also, it is preferable to allow each of the semiconductor layers of the light emitting layer forming portion 11 to grow to have cubic crystals; thus, since the Si substrate 1 and SiC layer 23 have cubic crystals, it is possible to provide superior crystalline property and cleavage.

Next, an explanation will be given of a manufacturing method of this semiconductor laser. First, an n-type Si substrate 1 having a thickness of approximately 450 μm is placed inside a reactor, and in an atmosphere of acetylene ($C_2H_2$) and hydrogen, this is held for approximately 60 minutes at a temperature of approximately 1020° C. so as to carry out a carbonizing process, thereby forming a SiC film 22 having a thickness of approximately 100 Å. Successively, in the same reactor, dichlorosilane ($SiH_2Cl_2$) serving as a material gas for silicon and acetylene serving as a material for carbon are introduced, so as to allow a SiC layer 23 to grow with a thickness of 2 μm by using a thermal CVD method. Next, an epitaxial growth device, such as an MOCVD, is used, and while maintaining the substrate temperature at approximately 600° C., a buffer layer 2, made from n-type $Al_{0.1}Ga_{0.9}N$, is allowed to grow with a thickness of 0.1 μm. The materials used in this case include, for example, triethyl gallium (TEG) serving as a material gas for a Group III element, trimethyl aluminum (TMA), ammonia ($NH_3$) serving as a material gas for Group V element and silane ($SiH_4$) serving as an n-type dopant are introduced. Thereafter, in the same manner as the aforementioned example, the light emitting layer forming portion 11 and the contact layer 7 are allowed to grow so as to form electrodes, thereby manufacturing the target product.

In the semiconductor light emitting device in accordance with the second embodiment, since the SiC film is formed on the Si substrate, and since the cubic crystal SiC layer is formed on this, it is possible to allow the cubic crystal SiC layer to grow with less defects in the crystal. Moreover, since the Group III nitride compound semiconductor lamination section is formed on the SiC layer, and since the difference in the lattice constants in the SiC layer and the GaN type compound semiconductor layer is small, it is possible to laminate a Group III nitride compound semiconductor layer having superior crystalline property with less susceptibility to lattice unconformity. As a result, the Group III nitride compound semiconductor layer, which has the same cubic crystal system as the Si substrate, is laminated with less defects in the crystal, and consequently to obtain a blue-color semiconductor light emitting device using the Si substrate with high light emitting efficiency. In other words, instead of the conventional idea that a Group III nitride compound semiconductor layer is laminated in the hexagonal crystal system, based upon the provision that even in the case of the cubic crystal system, it is possible to obtain high light emitting efficiency if the crystalline property is superior, the lamination is made in the cubic crystal system; thus, by using Si as the substrate and forming the SiC layer thereon in superior conformity therewith, it becomes possible to obtain a GaN type compound semiconductor crystal layer in the cubic crystal system in superior conformity with the substrate.

Moreover, since the Si substrate is used, the p-side electrode and the n-side electrode are taken out from the upper and lower sides of the chip respectively in the same manner as the aforementioned embodiment, thereby making it possible to greatly simplify the manufacturing process, and also to reduce the number of wire bonding processes upon its application. Furthermore, since the cubic crystal semiconductor layer is laminated on the Si substrate, the structures from the substrate to the semiconductor lamination section are allowed to epitaxially grow as cubic crystals, thereby making it possible to provide superior cleavage. In particular, in the case when a laser element is manufactured, a resonator having an end face with superior flatness is obtained, and a semiconductor laser having a superior oscillation property is consequently obtained.

In the above-mentioned example, the semiconductor laser has an electrode stripe structure in which only the p-side electrode is formed into a striped shape; however, another structure may be adopted in the same manner as the aforementioned embodiment. Moreover, when applied to the LED, the same structure as described above is obtained, and the same advantages can be obtained.

In accordance with this embodiment also, a vertical-type blue-color semiconductor light emitting device having electrodes on both upper and lower faces are obtained; therefore, it is possible to simplify the manufacturing processes, and consequently to cut costs, and upon application, the number of wire bonding processes can be reduced so that it is possible to obtain an easy-to-use semiconductor light emitting device at low costs. Moreover, since it is possible to provide cleavage, a laser resonator having a superior end face can be obtained, and a semiconductor laser having high performances with a short wavelength, which can be used for an optical disk memory having a high storage density and a high-precision laser beam printer, can be obtained.

Figure 5:
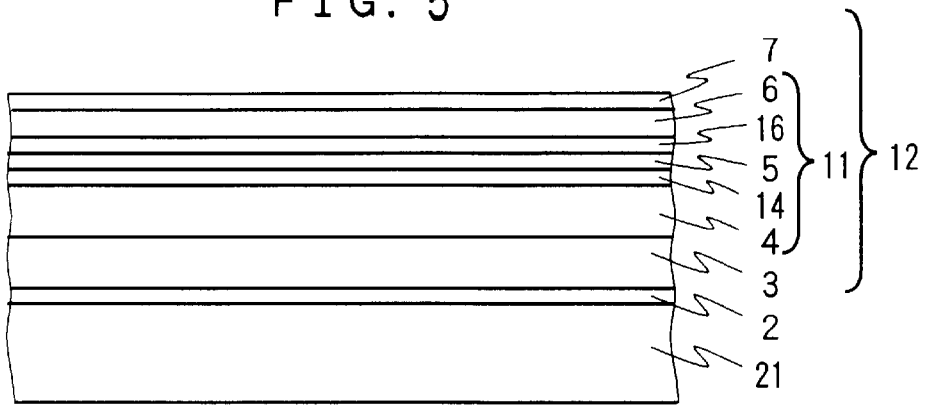
FIG. 5 is a drawing that shows manufacturing processes of an LD, which represent a third embodiment in accordance with the present invention.
Figure 5:
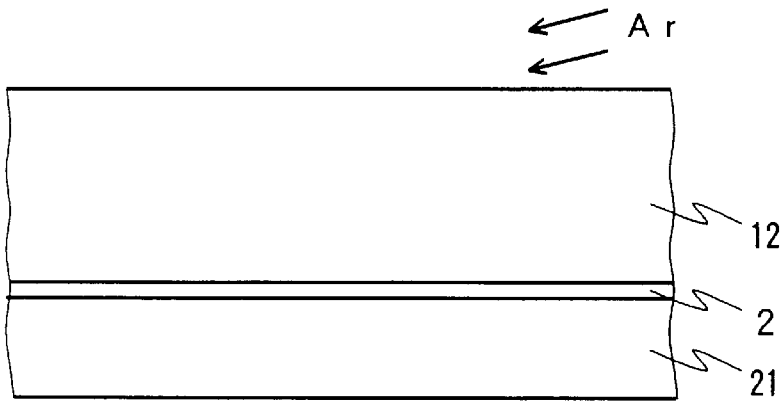
Figure 5:
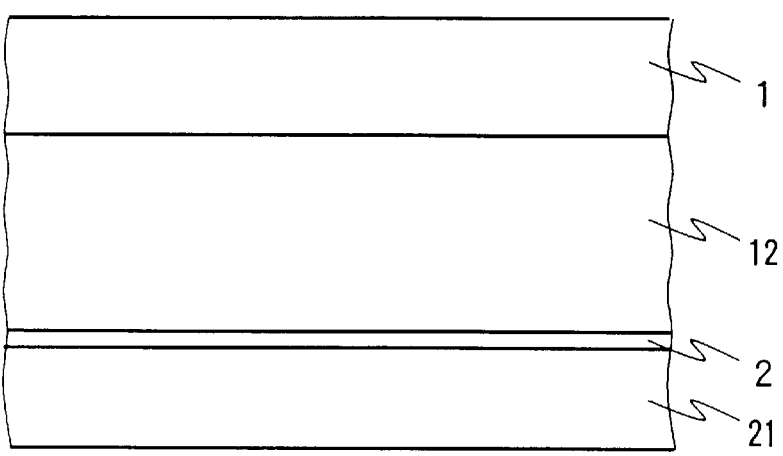
Figure 5:
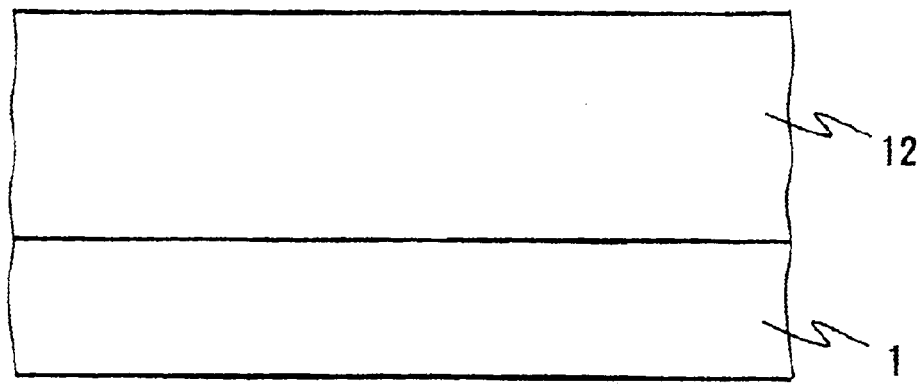
Figure 5:
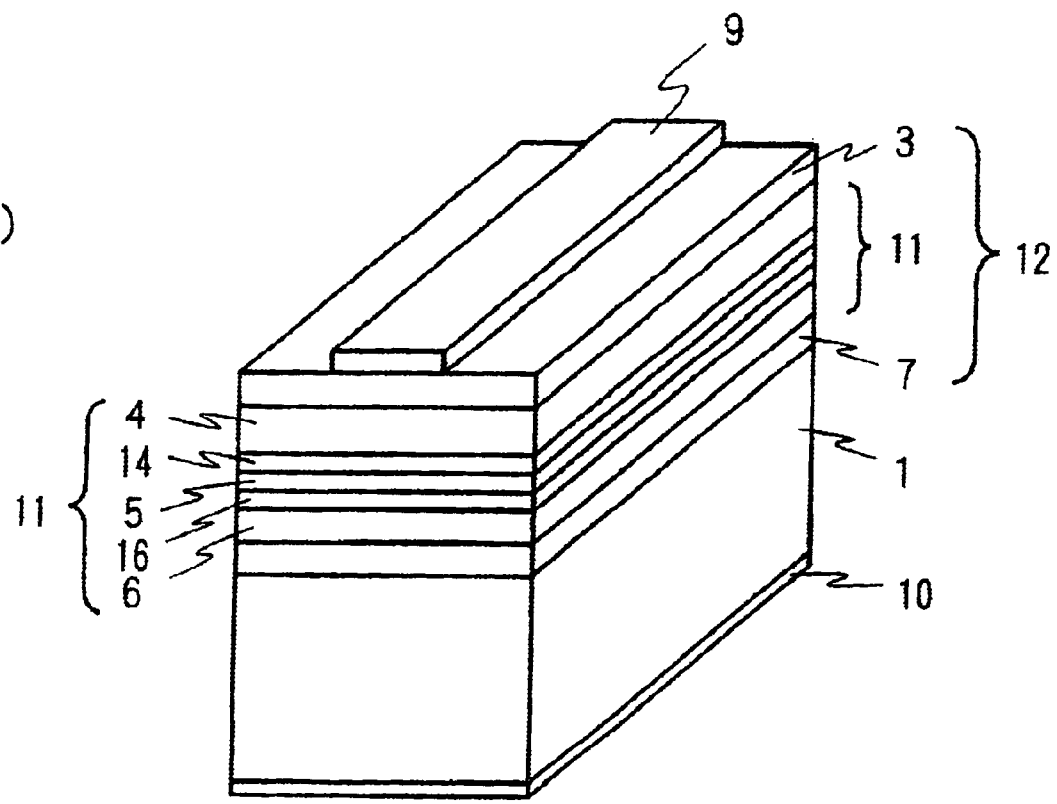
Figure 6:
FIG. 6 is a drawing that shows manufacturing processes of a different example of the third embodiment.
Figure 6:
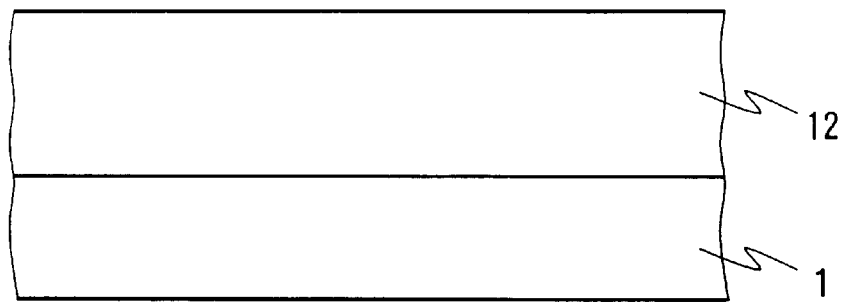
Figure 6:
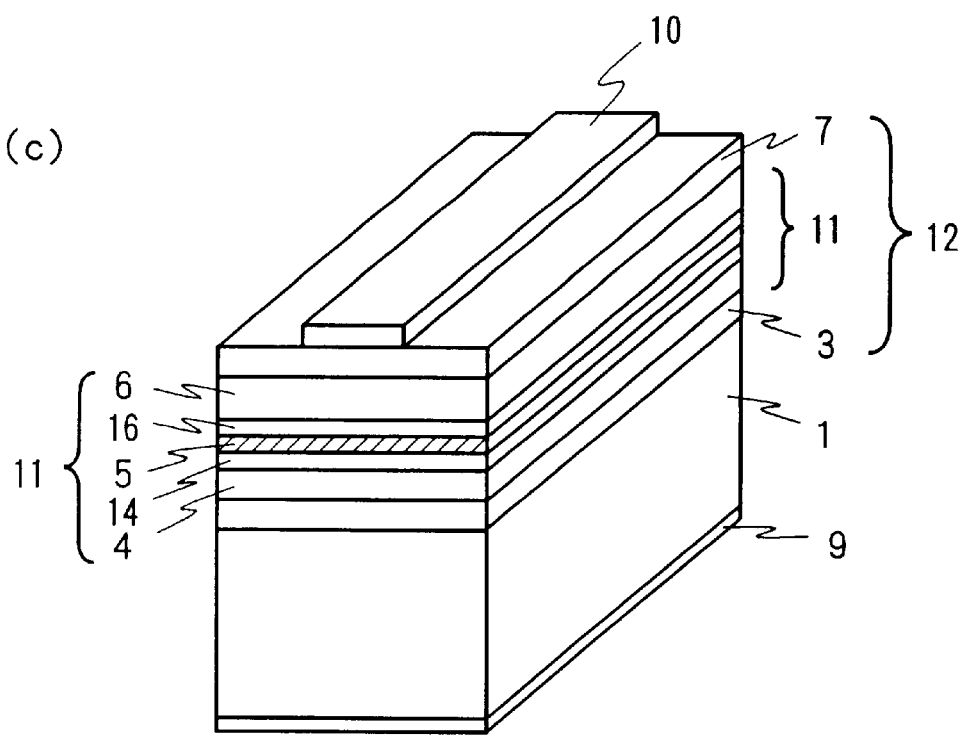

FIGS. 5 and 6 are explanatory drawings that show a third embodiment by which a vertical-type light emitting device is obtained by providing a conductive substrate as its substrate. In other words, in this embodiment, after a semiconductor layer has been laminated, a new substrate is bonded thereto and the sapphire substrate is removed so as to provide cleavage. Here, for example! Japanese Unexamined Patent Application 129984/1997 (Tokukaihei 9-129984) discloses a technique in which a semiconductor lamination section is stacked on a sapphire substrate and the surface side of the semiconductor lamination section or the sapphire substrate is made thinner, and an InP substrate is joined to the rear face of the sapphire substrate so as to provide cleavage. In this method in which the new substrate is bonded, it is press-bonded thereto after having been heated to approximately 600 to 700° C. In this manner, when the substrate used for providing cleavage is bonded at a high temperature, the bonded face is distorted, and upon cooling after the bonding process, cracks tend to occur in the semiconductor lamination section from the bonded portion, and the cracks tend to develop when it is handled or operated, resulting in degradation in the crystalline property, and the resulting reduction in the light emitting property.

Moreover, when the new substrate is joined without removing the sapphire substrate completely, the sapphire substrate is sandwiched between the semiconductor lamination section and the new substrate, with the result that the cleavage process has to be carried out in the sandwiched state. However, since sapphire has no cleavage, it is not possible to allow the very thin semiconductor lamination section having a thickness of approximately 10 $\mu$m to exhibit clear cleavage, and this develops cracks following the cracks of the sapphire, resulting in a failure to provide a clear mirror face to the light emitting end face.

In this embodiment, first, as illustrated in FIG. 5(a), a compound semiconductor constituting a light emitting layer forming portion 11 is laminated on a first substrate 21 having no cleavage made of, for example, a sapphire substrate; thus, a semiconductor lamination section 12 is formed. Then, as illustrated in FIG. 5(b), a plasma generated from an inert gas is applied to the surface of the semiconductor lamination section 12 so that the dangling on the surface is bond is exposed. Thereafter, as illustrated in FIG. 5(c), onto the surface of the semiconductor lamination section 12 to which the dangling bond is exposed, a second substrate 1 having cleavage, which has been subjected to a plasma application generated from an inert gas in the same manner, is affixed with the cleavage face of the second substrate 1 being coincident with the cleavage face of the semiconductor lamination section 12. Then, as illustrated in FIG. 5(d), the first substrate having no cleavage is removed. Thereafter, as illustrated in FIG. 5(e), electrodes 9 and 10 are formed, and the second substrate 1 is allowed to exhibit cleavage in a direction vertical to the stripe-shaped p-side electrode 10, thereby producing chips. The following description will discuss this embodiment in detail.

First, a sapphire substrate 21 is put into a MOCVD device, and in an atmosphere having only $H_2$ gas-flow, the substrate 21 is subjected to a thermal cleaning process for one minute at a temperature of approximately 1080° C. Next, a buffer layer 2 made from GaN is formed with a thickness of approximately 0.5 $\mu$m at a temperature of approximately 500° C. The reaction gases used at this time include: for example, triethyl gallium (TEG) serving as a material gas for a Group III element, arsine ($AsH_3$) serving as a material gas for a Group V element, dimethylhydrazine (DDMHy) and silane ($SiH_4$) serving as an n-type dopant. Next, the substrate temperature is raised to approximately 1050° C., thereby allowing an n-type contact layer 3 made from n-type GaN to grow with a great thickness of approximately 10 $\mu$m. Moreover, triethyl aluminum (TEA) is introduced thereto so as to allow an n-type clad layer 4 made from, for example, $Al_{0.12}Ga_{0.88}N$, to grow with a thickness of approximately 4 $\mu$m, and the substrate temperature is then lowered to approximately 800° C. Then, an active layer 5 having a multiple quantum well structure having laminated layers of 3 to 4 n-type light guide layers 14, each made from $In_{0.15}Ga_{0.85}N$ having a thickness of 0.1 $\mu$m, and 3 to 4 of those layers of non-dope, each made from $In_{0.02}Ga_{0.98}N/In_{0.2}Ga_{0.8}N$, with the total thickness of 10 to 20 nm, a p-type light guide layer 16 made from p-type $In_{0.15}Ga_{0.85}N$ having a thickness of approximately 0.1 $\mu$m, a p-type clad layer 6 made from $Al_{0.12}Ga_{0.88}N$ having a thickness of 0.8 $\mu$m and a p-type contact layer 7 made from GaN having a thickness of 1 $\mu$m are successively allowed to grow; thus, as illustrated in FIG. 5(a), a semiconductor lamination section 12 is formed. Here, the n-type clad layer 4, the n-type light guide layer 14, the active layer 5, the p-type light guide layer 16 and the p-type clad layer 6 constitute the light emitting layer forming portion 11.

Next, the wafer on which the semiconductor lamination section 12 is formed is loaded into a vacuum device provided with a plasma source, and as illustrated in FIG. 5(b), an Ar plasma is applied thereto. The plasma irradiation is carried out for 5 to 15 minutes under a pressure of approximately $10^{-4}$ Torr. As a result oxides and stain on the surface of the semiconductor lamination section 12 are removed to provide a clean surface, thereby allowing the dangling bond (unbonded hands to be exposed. At this time, for example, the GaP substrate 1 having cleavage, which serves as the second substrate, is also subjected to the plasma irradiation in the same device in the same manner, thereby being allowed to have a clean surface.

Next, the GaP substrate 1 and the semiconductor lamination section 12 are superposed with their cleavage faces being coincident with each other, and a slight pressure is applied thereto so as to bond them to each other. Here, in order to make the cleavage faces coincident with each other, the cleavage face of the semiconductor lamination section needs to be formed perpendicularly to the cleavage face of the striped-shape electrode 9 which is formed later, and since this is known based upon the orientation flat, etc. of the sapphire substrate and since the cleavage face of the GaP substrate 1 is also known by the direction of the orientation flat, the two cleavage faces can be made coincident with each other by rotating them by the corresponding angle required. The degree of coincidence of the cleavage faces is set to be within ±2° so as to obtain a clear cleavage face. At this time with respect to the cleavage face, in order to provide better cleavage faces to the respective members, it is preferable for the semiconductor lamination section 12 to use the (11-20) face and for the GaP substrate 1 to use (011) face.

Next, the sapphire substrate 21 is removed, and as illustrated in FIG. 5(d), a wafer having the GaP substrate 1 on which the semiconductor lamination section. 12 is formed is prepared. In the removing process of the sapphire substrate 21, while the GaP substrate 1 is maintained, a grinding process by the use of an abrasive material is carried out until the sapphire substrate 21 has been virtually removed, and the surface is then subjected to a mirror-face polishing process by chemical polishing. Here, upon removal of the sapphire substrate, portions of the buffer layer 2 and the contact layer 3 are also removed.

Thereafter, an Ni/Al layer is formed on the entire rear face of the substrate 1, for example, by vapor deposition, and on the surface of the semiconductor lamination section 12, a stripe-shaped n-side electrode 9 made from an Ni/Au layer with a width of approximately 10 $\mu$m is formed with intervals of, for example, 500 $\mu$m. Scratches are formed in this wafer by using a diamond needle, etc., with intervals of, for example, 700 μm in a direction perpendicular to the stripe-shaped n-side electrode 9, and this is allowed to exhibit cleavage along the scratches, thereby providing chips as shown in FIG. 5(e). Here, the separation in a direction parallel to the stripe-shaped electrode 9 is carried out by dicing. As a result, a semiconductor laser of a vertical type, which has the electrodes 9 and 10 placed on the upper and lower faces (a structure in which the electrodes are placed on the respective surface and rear face) and which also has the cleavage faces as the end faces of its resonator, is obtained.

In the above-mentioned embodiment, after the GaP substrate 1 has been bonded to the surface of the semiconductor lamination section 12 formed on the sapphire substrate 21, the sapphire substrate 1 is removed; however, another arrangement may be adopted in which: after the semiconductor lamination section 12 has been formed, a film, etc. is affixed onto the surface thereof, and maintained thereon, and after the sapphire substrate 1 has been removed, the GaP substrate 13 is affixed onto the surface exposed by the removal. This manufacturing process is shown in FIG. 6.

First, in the same manner as shown in FIG. 5(a), a buffer layer 2 made from GaN and respective semiconductor layers are laminated on the sapphire substrate 21 so that a semiconductor lamination section 12 is formed. Then, an ultraviolet (UV) setting film, etc. is affixed onto the surface thereof so as to maintain the semiconductor lamination section 12, and the sapphire substrate 21 is ground and removed in the same manner as described earlier. After the sapphire substrate has been completely removed, this is subjected to a mirror-face polishing process by chemical polishing in the same manner as described earlier. The surface, subjected to the mirror-surface polishing process, is subjected to a write etching process by using a sulfuric acid etching solution, and then washed with pure water and dried.

Thereafter, an Ar plasma is applied to the polished surface, as indicated by an arrow in FIG. 6(a), in the same manner as described earlier so that the dangling bond (unbonded hands) is exposed to the polished surface of the semiconductor lamination section 12. Thereafter, the GaP substrate 1 is bonded (FIG. 6(b)) in the same manner as the aforementioned embodiment. In this case, one portion of each of the semiconductor lamination section 12 and the GaP substrate 1 is allowed to exhibit cleavage, and the positions are matched with each other so that the cleavage faces are made coincident with each other. Then, on the entire rear face of the GaP substrate 1, an n-side electrode 9 made of a Ni/Au layer, and a p-side electrode 10 made of a stripe-shaped Ni/Al layer having a width of approximately 10 μm are formed with intervals of 500 μm, and scratched formed with intervals of, for example, 700 μm in a direction perpendicular to the stripe-shaped p-side electrode 10; thus, this is allowed to exhibit cleavage to provide chips (FIG. 3(c)) so that a semiconductor laser having the end faces of its resonator provided as mirror-faces through cleavage is obtained. In this example, different from the aforementioned example, the lower layer on which the semiconductor layers are laminated, as it is, forms the substrate 1 side, thereby providing a structure in which the n-type layer is placed on the substrate 1 side in the same manner as conventional arrangements.

In the third embodiment, even in the case of a type in which a semiconductor layer is laminated on a substrate having no cleavage such as a sapphire substrate by using a compound semiconductor such as GaN type and ZnO type, the substrate is formed in a manner so as, to easily exhibit cleavage after the formation of the semiconductor lamination section; therefore, it is possible to obtain a very clear cleavage face, and consequently to obtain a semiconductor laser having a superior light emitting property. Moreover, since it is not necessary to provide chips by dividing a hard sapphire substrate, it is possible to simplify the processes, and also to improve the yield.

Figure 7:
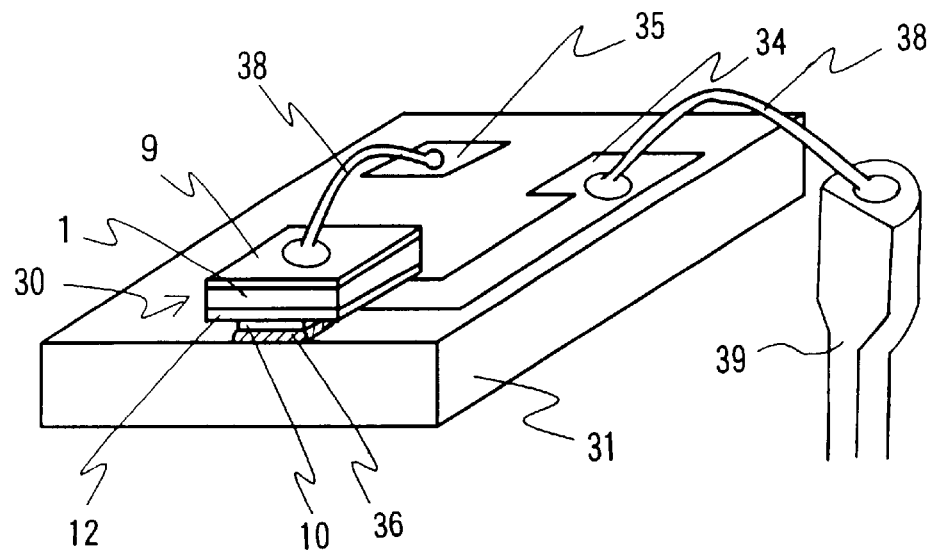
FIG. 7 is an explanatory drawing of a semiconductor laser in accordance with a fourth embodiment.

As illustrated in FIG. 7 which shows a perspective explanatory drawing of one example thereof, in a semiconductor laser in accordance with a fourth embodiment of the present invention, a laser chip (hereinafter, referred to as LD chip) 30 is provided with a conductive substrate 1, a semiconductor lamination section 12, made from a Group III nitride compound semiconductor formed on the conductive substrate, which is provided with at least an active layer, a first conductivity type clad layer and a second conductivity type clad layer sandwiching the active layer, a first electrode (p-side electrode) 10 placed on the upper surface side of the semiconductor lamination section 12, and a second electrode (n-side electrode) 9 placed on the rear face of the conductive substrate 1. Then, the LD chip 30 is bonded so that the p-side electrode 10 comes into contact with the sub-mount 31.

In other words, as described earlier, the inventors of the present invention have found that in the case of the application of GaAs, Si, or Ge as the substrate, a Group III nitride compound semiconductor layer is preferably laminated thereon. The application of such a LD chip having a Group III nitride compound semiconductor laminated on the conductive substrate makes it possible to eliminate an unwanted contact between electrodes, and also to provide a bonding process to the sub-mount with a superior heat-radiating property.

The LD chip 30 has a structure, for example, shown in FIGS. 1, 3 and 4. The sub-mount 31 is constituted by, for example, a member having an Si substrate on the surface of which an insulation film made from AlN or SiC is formed. Conventionally, such a member having an Si substrate on the surface of which an insulation film such as $SiO_2$ is formed has been adopted. However, the LD chip, made from a Group III nitride compound semiconductor, easily generates heat, as described earlier, and the radiation of heat gives great influences on the reliability of the element. For this reason, in the present invention, AlN (thermal conductivity: 3.5 W/(cm·K)) or SiC (4.9 W/(cm·K)) having a great thermal conductivity, is formed with a thickness of approximately 0.1 to 0.8 μm, for example, through a thermal CVD method. Further, a conductive film 34 made of Al, etc. is formed on the surface thereof by, for example, vapor deposition so as to form one of the electrodes, and one portion of the insulation film is removed so that the corresponding exposed portion of the Si semiconductor layer 35 is used for the other electrode.

At the end of this sub-mount 31, the LD chip 30 is placed with its face down (face down) so that the p-side electrode 10 is superposed on the conductive film 34, and is electrically bonded thereto through a conductive bonding agent 36 such as a solder agent. The other n-side electrode 9 of the LD chip 30 is electrically connected to the exposed Si semiconductor layer 35 through a gold wire 38, etc. Since the Si substrate is conductive, the other n-side electrode 9 is allowed to conduct to the rear face side of the sub-mount 31. For this reason, when the sub-mount is mounted on a header, etc. of a stem or other members, the other n-side electrode 9 is electrically connected to the header. On the other hand, the p-side electrode 10 is connected between the conductive film 34 and a lead 39 fixed to the stem, etc. through a gold wire 38, etc. so that the p-side electrode 10 is electrically connected to the lead 39.

In accordance with the invention of the fourth embodiment, a blue-color LD chip is formed as a vertical-type chip in which a Group III nitride compound semiconductor layer is laminated on a GaAs conductive substrate; therefore, the electrode on the side close to the active layer of the blue-color LD chip, which particularly requires heat radiation, is directly bonded to the sub-mount without an unwanted contact between the electrodes. As a result, it is possible to radiate heat efficiently to the sub-mount having a good thermal conductivity and also to further release heat to the header, etc. of the stem.

By using such a member having the Si substrate on the surface of which the insulation film having a great thermal conductivity such as AlN or SiC is formed, heat transmitted to the sub-mount is readily released so that it becomes possible to prevent an increase in the temperature of the LD chip. Moreover, the application of the Si substrate makes it possible to allow one of the electrodes to directly conduct to the rear face of the sub-mount, thereby making it possible to easily provide electrical connections between the electrodes.

It is preferable to use AlN or insulating SiC as the sub-mount because of its high thermal conductivity. In this case, a through hole is formed in one portion of the sub-mount and a metal rod is embedded therein, so that when one of the electrodes is connected to the surface side, the electrode end portion is allowed to directly conduct to the rear face of the sub-mount; therefore, in the same manner as the application of the aforementioned Si substrate, the electrode can be electrically connected simply by mounting it onto the header, etc. through a conductive bonding agent.

Here, in the case when the LD chip 30 has a structure in which a semiconductor lamination section is formed through the Si substrate through Sic, since the thermal conductivity of each of SiC (thermal conductivity 4.9 W/cm·K) and Si (thermal conductivity 1.7 W/cm·K) is greater than that of GaAS (thermal conductivity 0.47 W/cm·K) and sapphire (thermal conductivity 0.46 W/cm·K), it is possible to sufficiently obtain the heat radiating effects even when the bonding is made so as to allow the substrate side to contact the sub-mount, as will be explained below. As a result, since the distance from the bonding face to the active layer is sufficiently provided, the possibility of short-circuiting between the semiconductor layers is eliminated.

Figure 8:
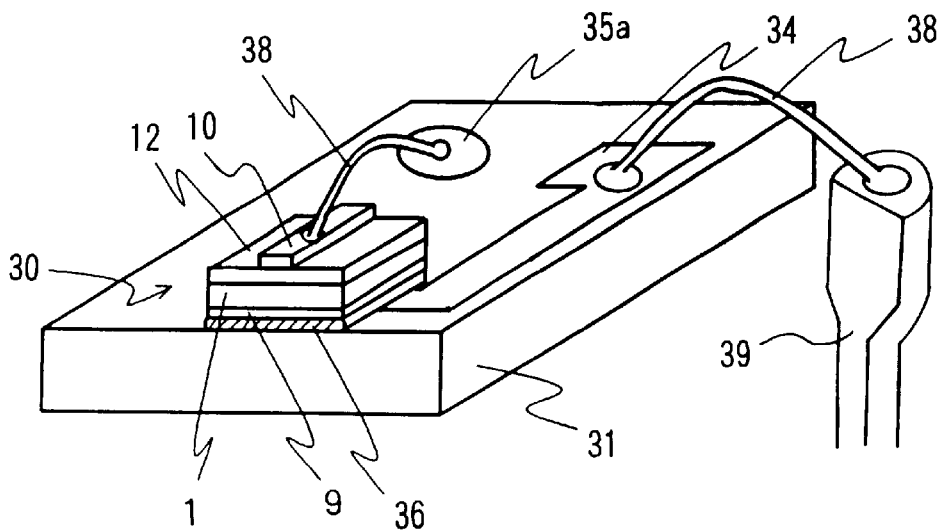
FIG. 8 is an explanatory drawing that shows a modified example of FIG. 7.

Here, FIG. 8 is the same explanatory drawing that shows another example. In this example, with respect to the LD chip 30, an SiC layer (cubic crystal system with conductivity) is formed on the surface of the above-mentioned Si substrate, and on this is laminated a Group III nitride compound semiconductor layer with a AlGaN type semiconductor layer interpolated in between as a buffer layer; thus, a blue-color LD chip is provided. Then, by utilizing the fact that the thermal conductivity of SiC and Si is high as described above, bonding is made so that the n-side electrode 9 is made in contact with the conductive film 34 on the sub-mount 31 with the substrate 1 side forming the lower side. Moreover, in this example, an amorphous (insulating) SiC substrate is used as the sub-mount 31, with one portion having a metal rod 35a exposed to the rear face of the sub-mount 31. Then, the p-side electrode 10 is wire-bonded to the metal rod 35a through a gold wire 38 so that the p-side electrode 10 is allowed to conduct to the rear face of the sub-mount 10.

In accordance with this example, the substrate of the LD chip 30 is placed on the lower side so that the distance from the surface of the sub-mount 31 to the active layer is as long as approximately 100 $\mu$m (in the Figure which is a conceptual drawing, the substrate of the LD chip is as long as 80 to 100 $\mu$2 m, while the semiconductor lamination section 12 is only several $\mu$m as a whole); therefore, even when, upon bonding, a conductive bonding agent 36 is too much, and placed in a swelled manner, the semiconductor layer is completely free from short-circuiting. Moreover, since SiC and Si are great in the thermal conductivity as described earlier, they enable sufficient heat radiation, and prevent the light emitting efficiency from dropping due to head. In other words, it is possible to improve the reliability of bonding sufficiently, while providing sufficient heat radiation.

In accordance with the fourth embodiment of the present invention, it is possible to carry out bonding on the sub-mount with high reliability, while sufficiently radiating heat of the LD chip in which a Group III nitride compound semiconductor is used. As a result, it becomes possible to prevent a reduction in the light emitting efficiency and degradation in the semiconductor layer due to heat, and consequently to provide a blue-color semiconductor laser with a high output and long service life.

FIGS. 9 to 12 show improved examples of a structure by which the sub-mount is mounted on a heat sink. In other words, as described above, a sub-mount having a good heat radiating property has been demanded, and AlN and SiC are applied thereto; however, SiC and AlN are insulators. For this reason, it is not possible to electrically connect one of the electrodes to the heat sink through the sub-mount, and as described above, there are cases in which a metal rod is embedded in the insulating sub-mount, and one of the electrodes is allowed to conduct to the rear face of the sub-mount through the metal rod. Here, for example, in the case of a semiconductor laser used in a CD, the size of the LD chip is approximately 0.25 mm×0.25 mm×0.1 mm in length×width×thickness, the size of the sub-mount is approximately 0.8 mm×0.5 mm×0.4 mm, and the external size of the semiconductor laser having these assembled therein is approximately 5.6 mm$\phi$×8 mm in diameter x height.

As described above, embedding the metal rod in AlN or SiC is difficult and causes high costs, because these materials are very hard. For this reason, it is difficult to use a material having a high thermal conductivity as the sub-mount. Moreover, even when an attempt is made to electrically connect the electrode of the LD chip to a heat sink, etc. by wire bonding through a wiring film formed on the surface of a insulating sub-mount, the wire bonding is not available in the case of a small-size package. In other words, due to a limitation in the package, since the area of the heat sink is only slightly greater than the area of the sub-mount (space distance: approximately, 0.5 to 1 mm), there is hardly any space to which a capillary (thickness: approximately 1.5 mm$\phi$) for wire bonding is inserted, and this tends to come into contact with the sub-mount, causing damages to the sub-mount. Moreover, since the thickness of the sub-mount is approximately 0.4 mm, it is not possible to automatically recognize the surface of the sub-mount and the surface of the heat sink that corresponds the bottom face thereof.

Furthermore, in a structure in which one of the electrodes is allowed to directly conduct to the rear face of the sub-mount, when, upon request from the user, the polarities of the n-side and p-side have to be changed, the corresponding change causes the structure of the sub-mount. In this embodiment, it becomes possible to easily connect the respective electrodes of the LD chip to the heat sink of a stem, etc., while using an insulating sub-mount having a superior thermal conductivity, without the need of embedding the metal rod.

Figure 9:
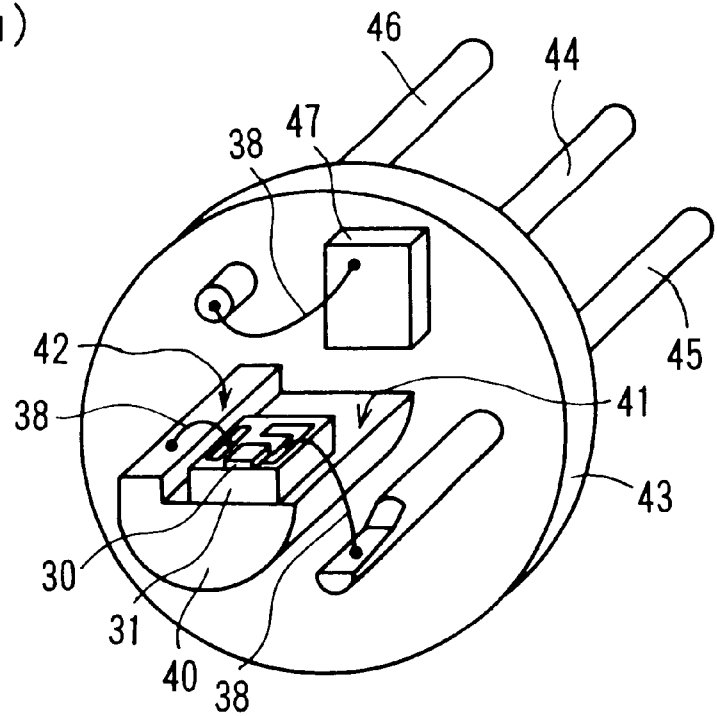
FIG. 9 is an explanatory drawing of a semiconductor laser in accordance with a fifth embodiment.
Figure 9:
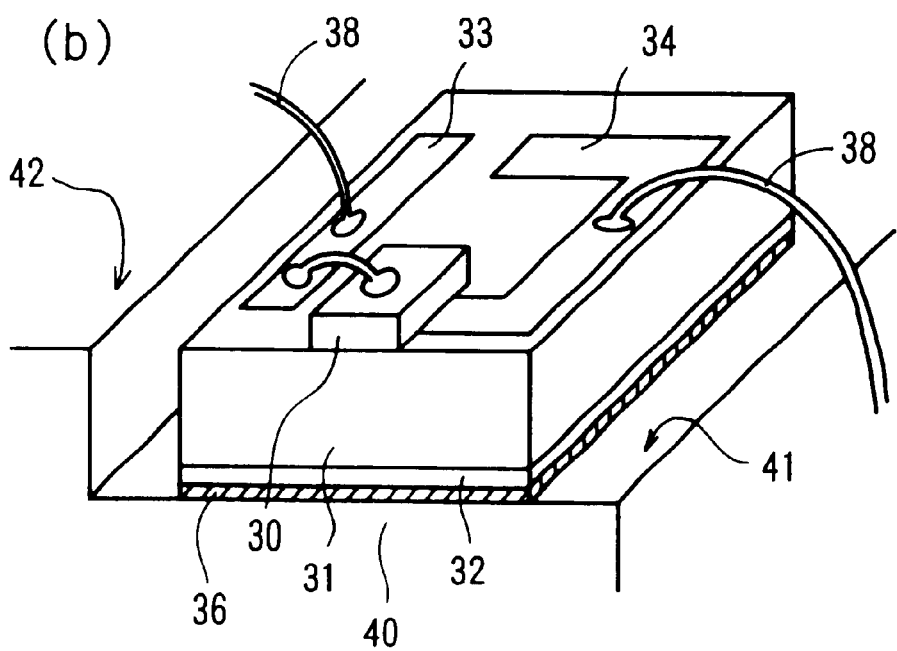

As illustrated in FIG. 9 which includes a perspective explanatory drawing that show a semiconductor laser with its cap removed and an explanatory enlarged view of a sub-mount section thereof, a fifth embodiment of the present invention has a structure in which a LD chip 30 is die-bonded to a sub-mount 31 made from an insulating material or one portion of which is made from an insulating material. Further, the sub-mount 31 is installed in a heat sink section 40. A step difference is formed in the heat sink section 40, and the sub-mount 31 is placed on the lower face 41 of the step, and wire bonding is made between the upper face 42 of the step and the sub-mount 31.

The heat sink section 40 is made of a metal material, for example, copper, which has a good thermal conductivity, and in the example of FIG. 9, it is fixed to a stem 43, and electrically connected to the first lead 44 fixed to the stem 43. As illustrated in FIG. 9, the heat sink section 40 has a step difference, and the sub-mount 31 is bonded to the lower face 41 by a solder agent 36, etc., such as indium. The step difference is virtually as high as the height of the sub-mount 31, and the surface of the sub-mount 31 is virtually flush with the upper face 42 of the step difference. As a result, in the case when wire bonding is carried out between the surface of the sub-mount 31 and a wiring film 33 by using a gold line 38, etc., the capillary needs not be inserted into a narrow space, and since there is virtually no difference in the heights, automatic recognition is available upon wire-bonding.

With respect to the LD chip 30, a chip having a structure, for example, shown in FIG. 4, may be used, or another structure shown in FIG. 1 or FIG. 3, or other structures may be adopted.

In this example, the sub-mount 31 is made of, for example, an SiC substrate, and its size is, for example, 0.8 mm×0.5 mm×0.4 mm in length×width×height, and first and second wires 33 and 34 that are electrode patterns, are formed on the surface thereof by using an Al coat film, etc., and a metal film 32 is formed on the rear face by using an Au/Sn coat film, etc. Consequently, this structure makes it possible to easily make connection to the heat sink section 40 through the solder agent 36. The p-side electrode of the LD chip 30 as described earlier is bonded to the second wiring film 34 through a conductive bonding agent such as Au/Sn, not shown, so that the p-side electrode is connected to the second wiring film 34 and the n-side electrode of the LD chip 30 is electrically connected to the first wiring film 3 3 by wire bonding through a gold wire 38. Then, after the sub-mount 31 has been installed in the heat sink section 40 (bonded by solder agent 36, etc.), the first wiring film 33 is connected to the upper face 42 of the heat sink 40 and the second wiring film 34 is connected to a second lead 45, respectively by wire bonding through gold wires 38, etc. Thus, the n-side electrode of the LD chip 30 is electrically connected to the first lead 44 of the stem 43 through the upper face 42 of the heat sink section 40, and the p-side electrode is also electrically connected to the second lead 45 of the stem 43.

Not limited to SiC, the sub-mount 31 may be formed by any material as long as it has a great thermal conductivity, and as described earlier, for example, AlN, and an Si substrate on the rear face of which an insulation coat film having a great thermal conductivity such as SiC and AlN may be used.

In addition to the first and second leads 44 and 45, the third lead 46, which is electrically separated, is fixed to the stem 43, and electrically connected to one of the electrodes of the monitor-use light-receiving element 47 bonded onto the stem 43, in the same manner, through a gold wire 38, etc. This monitor-use light-receiving element 47 is used for monitoring the variation in the output of the LD chip 30, and adjusts the driving power of the LD chip 30 so as to be always maintained constant. A pick-up-use semiconductor laser is obtained by putting a cap, not shown, on the periphery thereof.

In accordance with this example, a step difference is formed i n the heat sink section 40 in which the sub-mount 31 having the LD chip 30 bonded thereto is installed, and the LD chip 30 is bonded to the lower face so that the surface of the sub-mount 3I and the upper face of the heat sink 40 are virtually flush with each other; thus, even in the case when the sub-mount 31 is made from an insulating material having a great thermal conductivity, and is mounted on the small heat sink 40, the respective electrodes of the LD chip 30 can be electrically connected easily through the surface of the sub-mount 31 by wire bonding. Consequently, SiC and AlN, etc., which have a great thermal conductivity, can be used as the sub-mount, thereby making it possible to improve the heat radiating efficiency of the LD chip, and also to ensure a high output and high reliability.

Moreover, in accordance with this example, both of the electrodes can be electrically connected to the leads of the stem by wire bonding; therefore, even in the case when the user requests to change the polarities of the electrodes, the corresponding change can be made simply by changing the connection of the wire bonding, and a semiconductor laser which meets the request of the user can be easily prepared.

Figure 10:
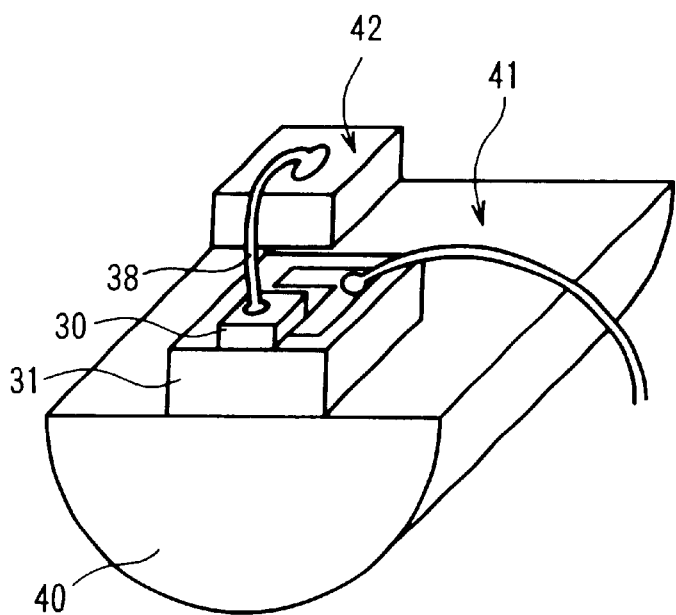
FIG. 10 is an explanatory drawing that shows a modified example of FIG. 9.

FIG. 10, which shows another example of a semiconductor laser in accordance with the fifth embodiment, is a drawing that shows a modified example of the step difference of the heat sink. In other words, the step difference does not need to be formed all over the heat sink 40, and it is only necessary to form a higher portion 42 at one portion thereof. For this reason, it is only necessary to form a certain portion having a step difference in the space within the heat sink 40. Here, the other portions are the same as those shown in FIG. 9, and the corresponding members are indicated by the same reference numbers, and the description thereof is omitted. With this structure, the installation of the sub-mount 31 is carried out without any problems, and even the small heat sink 40 is readily subjected to the installation process of the sub-mount 31 and the wire bonding process.

Figure 11:
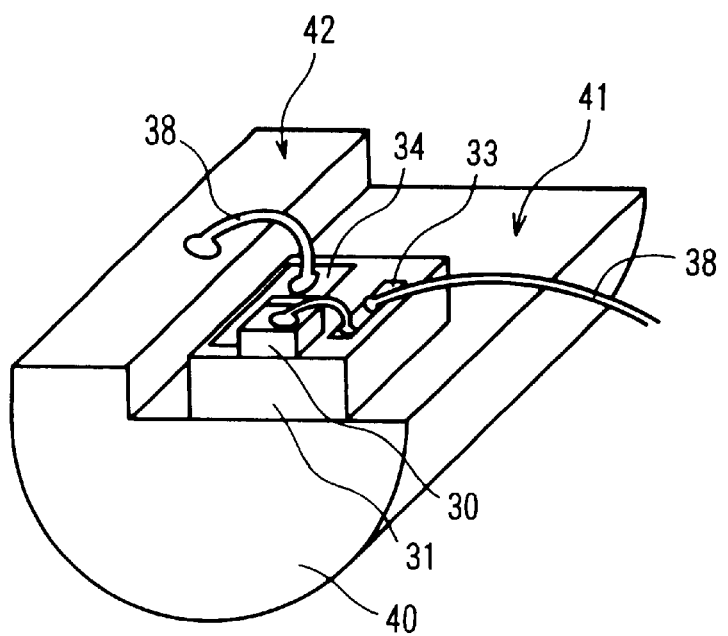
FIG. 11 is an explanatory drawing that shows another modified example of FIG. 9.

FIG. 11 is a drawing that shows another example in which the polarities are changed. In this example, the first and second wiring films 33 and 34 that are electrode patterns on the sub-mount 31 are formed in a manner opposite to the example of FIG. 9, and in this case, the bonding process, etc. of the LD chip 30 is carried out in the same manner as those shown in the example of FIG. 9 so that the p-side electrode of the LD chip 30 is connected to the first lead 44 through the second wiring film 34 and the n-side electrode is connected to the second lead 45 side through the first wiring film 33, respectively. Here, the other portions are the same as those of FIG. 9; therefore, the corresponding members are indicated by the same reference numbers, and the description thereof is omitted. In this example, the sub-mount in which the layout of the first and second wiring films is changed is used; however, only the wire bonding may be altered with the same sub-mount as FIG. 9 being used.

Figure 12:
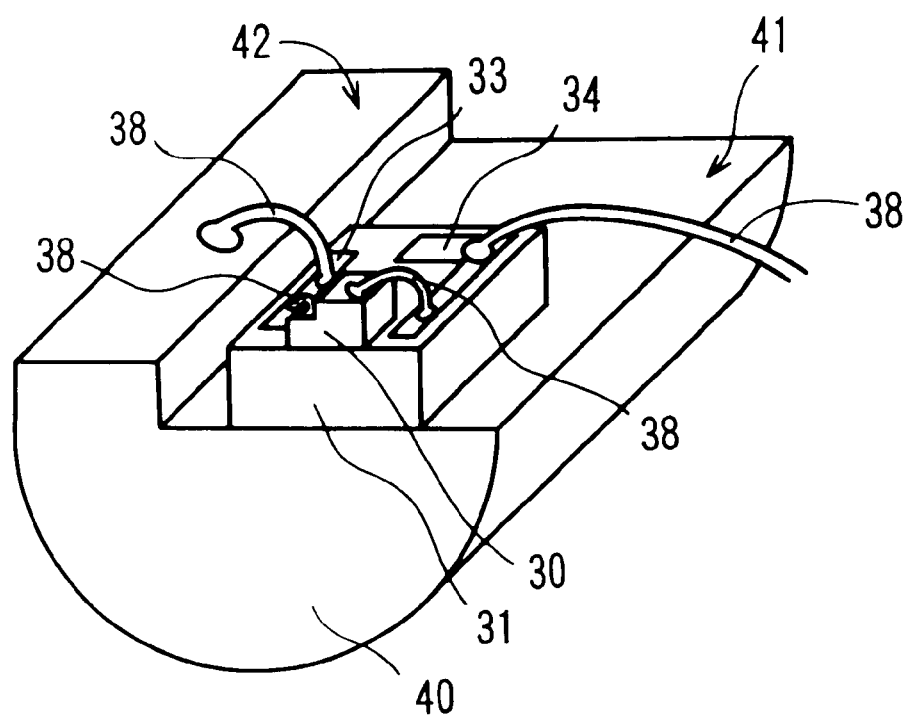
FIG. 12 is an explanatory drawing that shows still another modified example of FIG. 9.

FIG. 12 is a drawing that shows still, another example in which the substrate of the LD chip 30 is made of an insulating substrate such as sapphire. Since a sapphire substrate does not have a great thermal conductivity, it is not preferable to bond this substrate to the sub-mount 31 from the viewpoint of heat radiation; however, it has a superior bonding property. In other words, since the substrate of the LD chip 30 has an insulating property, the n-side electrode is formed onto the n-type layer that is exposed by removing one portion of the laminated semiconductor lamination section by using an etching process, etc.; therefore, the n-side electrode and the p-side electrode are formed on the same face side, that is, on the upper face side of the LD chip 30, so that both of the electrodes are wire-bonded to the wiring films 33 and 34 on the surface of the sub-mount 31 respectively through gold wires 38. Therefore, wire bonding is made between the first and second wiring films 33, 34 and the upper face 42 and the second lead of the heat sink 40 respectively through gold wires 38, etc.; thus, in the same manner as the example of FIG. 9, the respective electrodes and the leads are electrically connected.

In accordance with the fifth embodiment of the present invention, even in the case of a semiconductor laser with a small package that needs to have a superior heat radiating property, an insulating material having a good thermal conductivity can be used as the sub-mount, thereby making it possible to radiate heat very efficiently. As a result, it is possible to increase the output of the LD chip, and also to improve the reliability greatly. In particular, in the case when the LD chip is made of a Group III nitride compound semiconductor, it tends to generate heat; however, the present invention makes it possible to regulate the temperature rise, and consequently to provide a blue-color semiconductor laser with a high output and long service life.

Figure 13:
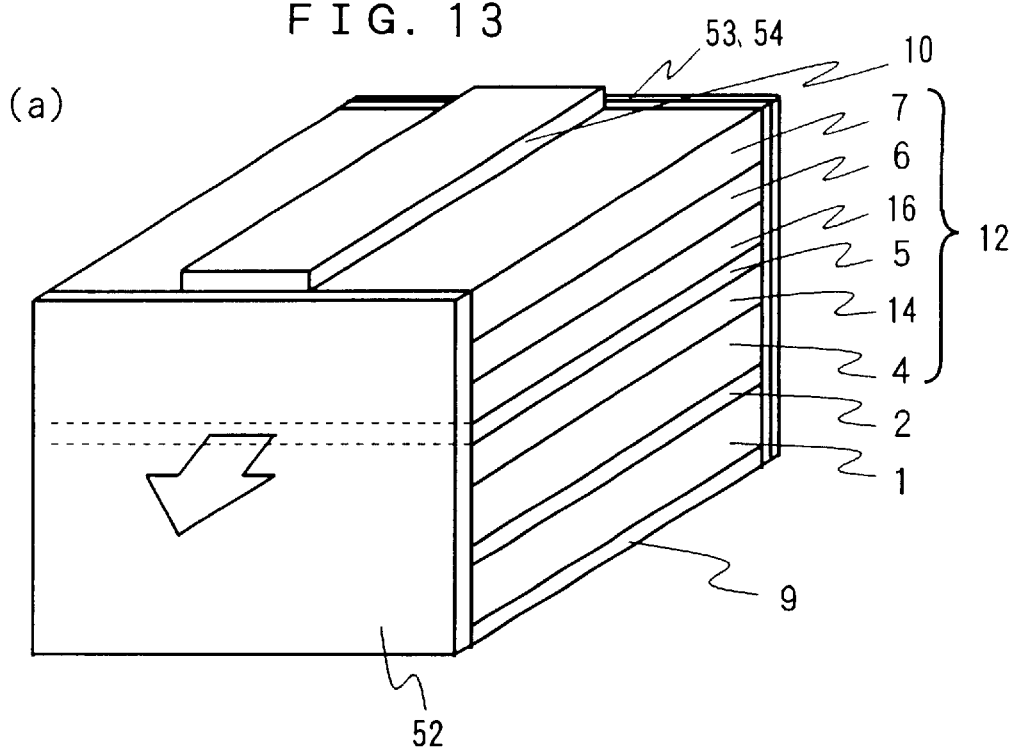
FIG. 13 is an explanatory drawing of a semiconductor laser in accordance with a sixth embodiment.
Figure 13:
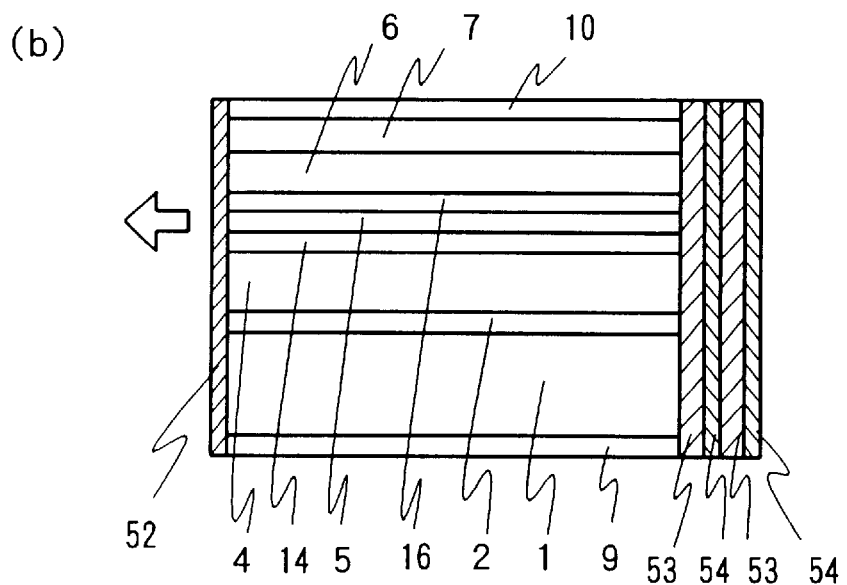

FIG. 13 is an explanatory drawing that shows a LD chip in accordance with the sixth embodiment. In other words, even when the superior heat radiating property is provided as described above, it is still difficult to obtain a high output from a sufficiently low operational voltage in the case of a light emitting device made from a GaN type compound semiconductor. One reason for this is because the end face constituting one portion of an optical resonator has degradation in its flatness; therefore, the present embodiment has made an attempt to improve the flatness.

In a conventional semiconductor laser using a GaAs type compound semiconductor, it is possible to provide a clear mirror surface through cleavage because of its superior crystalline property; however, the density of its surface level is high and it is therefore susceptible to end-face damages (COD). Therefore, in some cases, a protective insulation film is formed on the end face.

Moreover, for example, as disclosed in Japanese Unexamined Patent Application Nos. 191171/1996 (Tokukaihei 8-191171) and No. 270569/1997 (Tokukaihei 9-270569), in the case of a blue-color semiconductor laser in which a Group III nitride compound semiconductor is laminated, since a hexagonal-crystal system sapphire substrate is used, it is not possible to exhibit cleavage, and in order to increase its reflection coefficient, a multi-layered film of a dielectric film is formed on its end face.

As described above, in the conventional blue-color LD chip using a Group III nitride compound semiconductor, since the Group III nitride compound semiconductor is generally laminated on a sapphire substrate, it is not possible to exhibit cleavage, and since the Group III nitride compound semiconductor layer is chemically very strong, it end face is formed by physical etching such as an RIE method. This physical etching fails to provide a complete flatness on the surface due to ion impacts and contamination. Therefore, even when a dielectric film is laminated on the end face that is not allowed to have a complete flatness, the flatness is not sufficiently compensated, resulting in a failure to provide a complete reflection face of a resonator. In other words, although, from the macroscopic point of view, a laminated film of the dielectric film is obtained so as to provide a high reflection coefficient, the direction of light reflection varies from the predetermined direction of the resonator due to scratches and contamination of the end face, resulting in a failure to provide a sufficient external differential quantum efficiency and to improve the threshold.

As described above, the sixth embodiment makes it possible to use a semiconductor substrate as the substrate, and also to provide cleavage; therefore, the flat face resulting from the cleavage face is utilized to increase the reflection efficiency, and, the flattened end face constituting one portion of the resonator is utilized to control the reflection coefficient, thereby making it possible to improve the external differential quantum efficiency and the threshold, and consequently to obtain a blue-color semiconductor laser for providing a high output.

In other words, as illustrated in FIGS. 13($a$) and 13($b$) that are explanatory perspective and side views showing one example of the invention, the semiconductor laser chip is provided with: a substrate 1 and a semiconductor lamination section 12 which is made from a Group III nitride compound semiconductor formed on the substrate 1, and includes at least an active layer 5, a first conductivity type (n-type) clad layer 4 and a second conductivity type (p-type) clad layer 6 sandwiching the active layer 5. At least one of the end faces that constitute a semiconductor laser chip optical resonator is formed into a flat face, and an insulation film 52 is formed on the flat face as a single layer film or a multi-layered film 53, 54 containing a plurality of kinds of films having different refractive indexes.

In the same manner as the structure shown in FIG. 1, in the example shown in FIG. 13, the Group III nitride compound semiconductor layer is laminated on a GaAs substrate 1, and its end face is formed into a flat face through cleavage. On its light-releasing end face (in FIG. 13, the light-releasing direction is indicated by arrow), a first insulation film 52 made from, for example, $Al_2O_3$, is laminated with a thickness represented by $\lambda/2n_1$, where $\lambda$ represents the light-emission wavelength thereof, and $n_1$ represents the refractive index of the first insulation film. Moreover, on the respective surfaces of the light-releasing face and the opposing face (rear end face), a second insulation film 53, made from, for example, $Al_2O_3$, is formed with a thickness represented by $\lambda/4n_2$, and a third insulation film 54, made of, for example, $TiO_2$, is formed with a thickness represented by $\lambda/4n_3$. Moreover, the second and third insulation films 53 and 54 are formed repeatedly, thereby providing a multi-layered film consisting of four layers. In this manner, the insulation films, each having a thickness of $\lambda/4n$, are laminated into a multi-layered film so that its reflection coefficient is easily adjusted and the lamination of even number of layers makes it possible to increase the reflection coefficient. The reflection coefficient of the rear end face is preferably set as high as possible, that is, to approximately 50 to 90%, in general, approximately 70%. In contrast, with respect to the light-releasing face side, the reflection coefficient is set to be lower, and the insulation film having the thickness of $\lambda/2n$ as described above is laminated as a single-layer film or a multi-layered film, or odd number of the layers, each having a thickness of $\lambda/4n$, are laminated into a multi-layered film. The reflection coefficient is set in the range of 5 to 60%, so as to be changed depending on the usage; for example, in the case when a great output is desired, it is set to not more than 10%, and in the case when an improved temperature property is desired, it is set to 50 to 60%, etc. With respect to the insulation film, $Al_2O_3$ and $TiO_2$, are preferably used because of their superior adhering property to the Group III nitride compound semiconductor; and in addition to this, $SiO_2$, $Si_3N_4$, etc. may be used.

In order to form the insulation film, after the semiconductor lamination section 12 and the electrodes 9, 10, which will be described later, have been formed, scribe cuts are formed with intervals of approximately 700 μm in a direction perpendicular to the extending direction of the p-side electrodes, and an impact is applied to this, thereby allowing it to exhibit cleavage; thus, bar-shaped members are obtained from the wafer. Then, the bar-shaped members are subjected to sputtering in a sputtering device with their cleavage faces up so as to form an insulation film thereon. This film formation process is carried out on both of the cleavage faces; thereafter, the bar-shaped members are diced and divided into chips. Thus, LD chips, each having an insulation film on its end face, are obtained. Here, the insulation film is not necessarily formed on both of the end faces. In the case when a complete mirror surface is obtained through cleavage, a sufficient degree of reflection coefficient is obtained so that it is not necessary to provide the insulation film on the light-releasing side.

In this example, the face on which the insulation film is formed has its flat face through cleavage. The Group III nitride compound semiconductor tends to have defects in the crystal; however, as will be described later, the lamination is made in the cubic crystal system in conformity with the substrate, and allowed to exhibit cleavage, thereby making it possible to form a virtually flat face even from the microscopic point of view. Moreover, by installing the insulation film, it becomes possible to sufficiently control the reflection coefficient, and consequently to form a superior resonator end face which enables effective reflection in the resonator.

The structure of the LD chip is the same as that shown in FIG. 1; therefore, the corresponding members are indicated by the same reference numbers, and the description thereof is omitted. Here, the LD chip may have the same structure as that of FIG. 3 or FIG. 4 with the same effects.

In accordance with the sixth embodiment, the blue-color LD chip has a structure in which the Group III nitride compound semiconductor layer is laminated on the conductive substrate of GaAs so as to form the cubic crystal system; therefore, it is possible to easily provide cleavage, and consequently to provide a flat end face. As a result, the formation of the insulation film on the surface makes it possible to adjust the reflection coefficient, and also to eliminate irregular reflection at the end face; therefore, all the reflected light is allowed to return into the resonator, resulting in efficient oscillation. In other words, in the case of a conventional end face formed by dry etching, small irregularities are inevitably formed on the surface, with the result that, even when a dielectric film is formed so as to adjust the reflection coefficient, it is not possible to sufficiently increase the differential quantum efficiency; however, in the present invention, since the end face is formed into a flat face, no irregular reflections occur on the end face, thereby making it possible to improve the differential quantum efficiency, and also to reduce the threshold value.

Moreover, SiC and GaN substrates may be used so as to provide cleavage in the same manner, and these cases also make it possible to obtain the flat end face, and consequently to improve the differential quantum efficiency and the threshold value. Here, in these cases, it is preferable to use a substrate of the cubic crystal system and to laminate a Group III nitride compound semiconductor layer of the cubic crystal system; thus, it becomes possible to obtain a clearer flat face.

Figure 19:
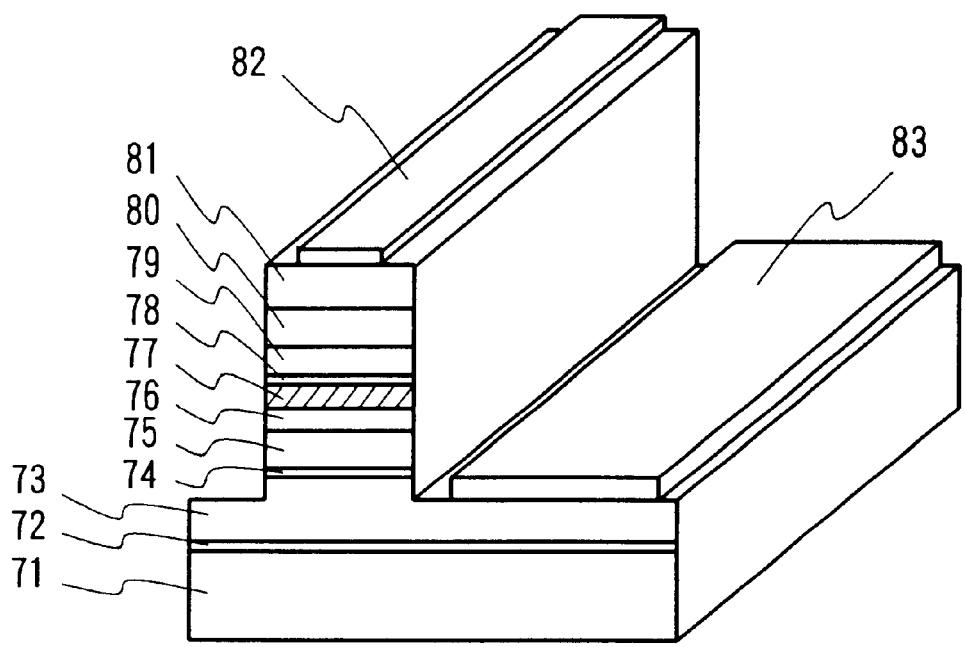
FIG. 19 is an explanatory cross-sectional view that shows a conventional blue-color semiconductor light emitting device.
Figure 20:
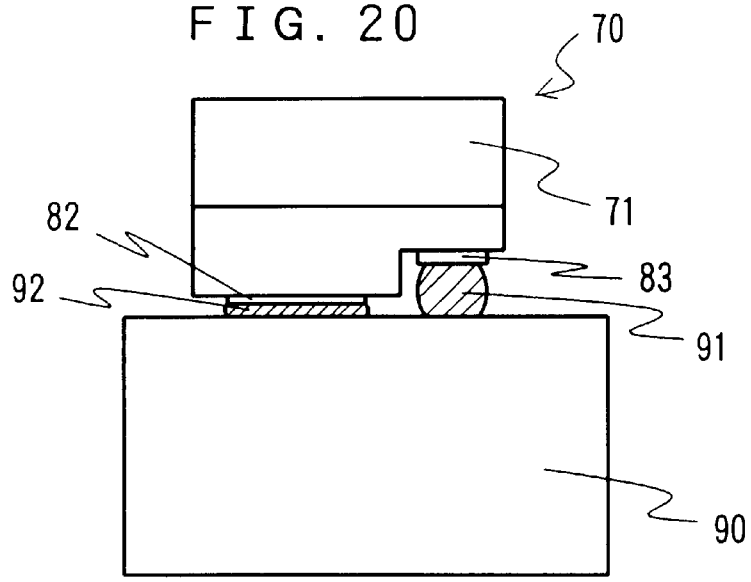
FIG. 20 is an explanatory drawing that shows an example in which a conventional blue-color LD chip is bonded to a sub-mount.
Figure 21:
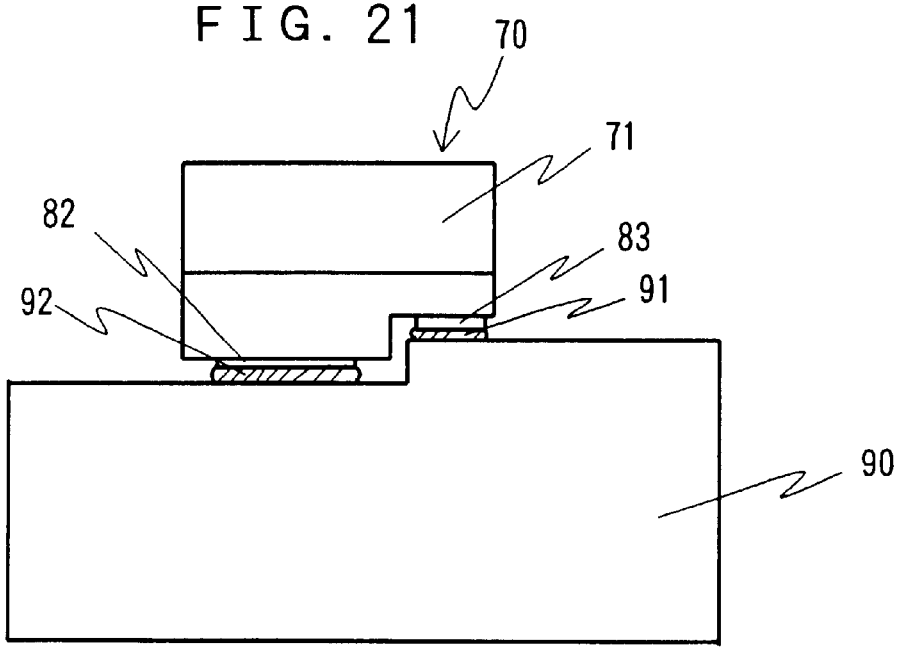
FIG. 21 is an explanatory drawing that shows another example in which a conventional blue-color LD chip is bonded to a sub-mount.

Furthermore, in this example, a substrate having cleavage is used so as to provide a cleavage face; however, even in the case of a LD chip in which a Group III nitride compound semiconductor is laminated on a sapphire substrate as illustrate in FIG. 19, by flattening the end face formed by dry etching, it becomes possible to improve the differential quantum efficiency and the threshold value through the adjustment of the reflection coefficient in the same manner. For example, instead of the cleavage in the above-mentioned example, after a wafer has been divided into bar-shaped members, a Group III nitride semiconductor is formed as a film on the end faces of them, and the aforementioned insulation film is further formed thereon as a film so that the material having virtually the same refractive index as the active layer makes it possible to flatten the rough end face resulting from dry etching, and the insulation film formed thereon makes it possible to adjust the reflection coefficient. Therefore, it is possible to obtain a desired reflection coefficient without causing irregular refection, and consequently to improve the laser characteristics. Such a flattening method for the end face may also be carried out by chemical polishing, etc.

In accordance with the sixth embodiment, the end face of the LD chip using a Group III nitride compound semiconductor is flattened so that the insulation film is allowed to adjust the reflection coefficient; thus, it is possible to improve laser characteristics such as the differential quantum coefficient and the threshold value. As a result, it becomes possible to provide a blue-color semiconductor laser having a high output with a low operational voltage.

Figure 14:
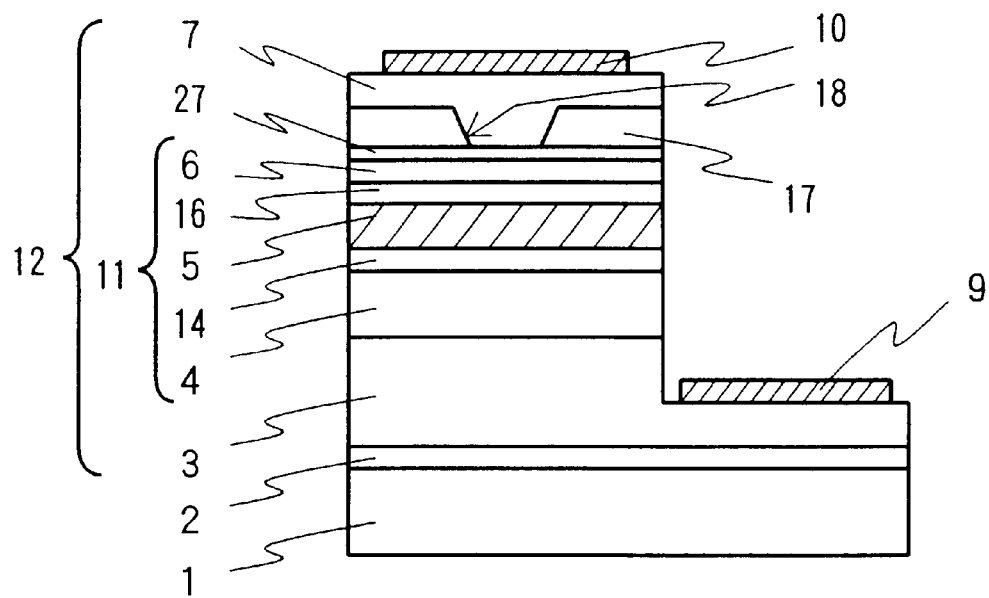
FIG. 14 is an explanatory cross-sectional view showing a semiconductor laser in accordance with a seventh embodiment.
Figure 15:
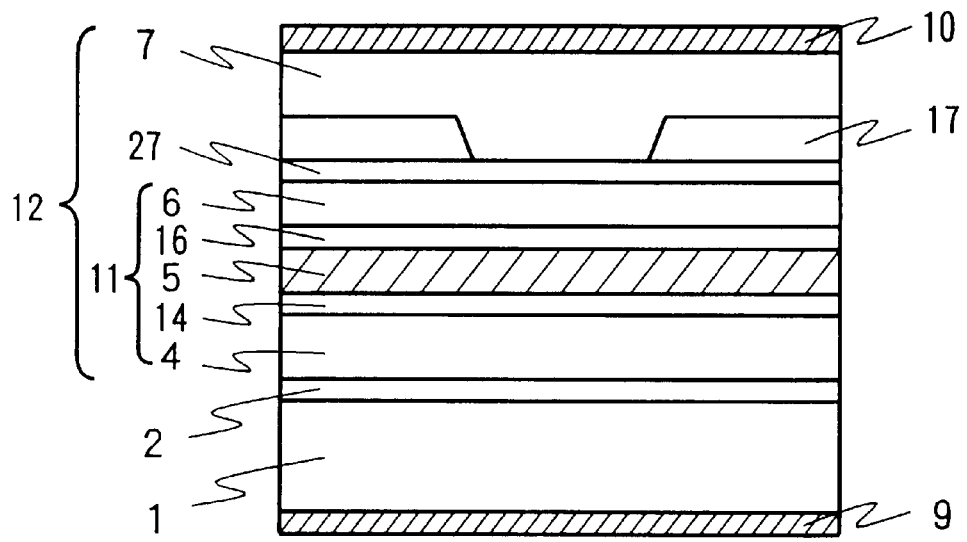
FIG. 15 is an explanatory, cross-sectional view showing a modified example of FIG. 14.
Figure 16:
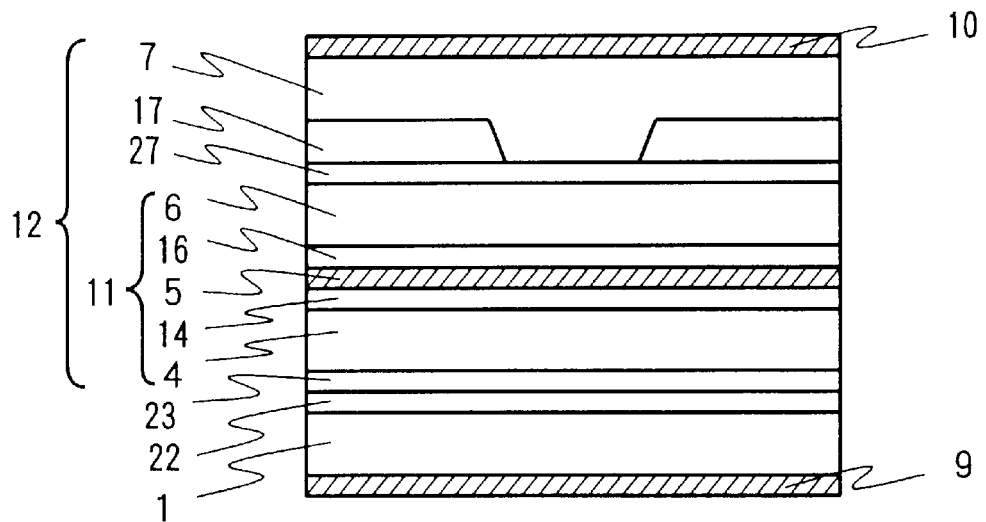
FIG. 16 is an explanatory drawing that shows still another modified example of FIG. 14.

FIGS. 14 to 16 are explanatory drawings that show a LD chip in accordance with the seventh embodiment. In other words, as described the aforementioned embodiments, the Group III nitride compound semiconductor is very stable thermally as well as chemically, and is not subjected to wet etching. Therefore, different from AlGaAs type and AlGaInP type compound semiconductor, it is not possible to form a stripe-shaped opening section with high reproducibility without causing damages, so as to provide an inner current constriction layer therein.

In other words, in a conventional Group III nitride compound semiconductor, no etching is available except for dry etching such as an RIE method, and dry etching tends to give serious damages to a semiconductor layer, resulting in degradation in the crystalline property of the semiconductor layer when allowed to re-grow, a reduction in the controllability of the etching rate, and degradation in the reproducibility. For this reason, the upper portion (p-side) electrode is formed into a stripe shape to provide a stripe-shaped current injection area, or a mesa-stripe structure in which semiconductor layers on both of the sides of the p-side electrode are etched to the upper portion (p-type) of the clad layer in a mesa-shape is adopted, thereby specifying an injection area for a current.

Here, Japanese Unexamined Patent Publication No. 246670/1997 (Tokukaihei 9-246670) discloses a method in which a current constriction layer made from an insulating Group III nitride composition semiconductor is formed by etching or a selective growing method; however, no description has been given about a specific method for etching, and in the case of the selective growing method, when the growing temperature is set high, deposition is made also on SiO2; therefore, it is necessary to set the growing temperature low, and such a low temperature causes degradation in the crystalline property or amorphous, resulting in a failure to form good crystals.

In this case, it is not possible to form a current constriction layer in which a stripe-shaped opening section by using the wet etching; consequently, it is not possible to sufficiently inject a current into a light emitting area, with the result that the current expands to cause a rise in the oscillation start current (hereinafter, referred to simply as the threshold value) and a drop in the external differential quantum efficiency (hereinafter, referred to simply as the quantum efficiency). As a result, it is not possible to ensure a high output and high reliability. For this reason, it is necessary to provide a current constriction layer at a portion close to the active layer and to lower the threshold value, in order to obtain a semiconductor laser having a high light emitting efficiency (quantum efficiency).

As illustrated in FIG. 14, a semiconductor laser in accordance with a seventh embodiment is provided with a semiconductor lamination section 12, formed on a substrate 1, that is made from a Group III nitride compound semiconductor and that includes at least an active layer 5 and a first conductivity type (n-type) clad layer 4 and a second conductivity type (p-type) clad layer 6 sandwiching the active layer 5. Here, in the semiconductor lamination section 12, a current constriction layer 17 made from an insulation material, having a stripe-shaped opening section (stripe groove 18), is provided.

With respect to the current constriction layer 17, an insulation film made from an oxide, nitride or oxidized nitride of Si or Al, such as $SiO_2$, $Si_3N_4$ and $Al_2O_3$, is preferably used because it is readily etched with ease in handling. This current constriction layer 17, which is used for concentrating a current on a stripe groove 18 having a width of, for example, 4 $\mu$m that extends in a direction perpendicular to the paper face of FIG. 14 so as not to flow through the other areas, is formed with a thickness in the range of approximately 0.1 to 0.6 $\mu$m. Since the current constriction layer 17 is not a semiconductor layer, it is formed as follows: Upon completion of the lamination of semiconductor layers up to an etching stop layer 27, which will be described later, this is taken out of the epitaxial growth device for semiconductor layers such as an MOCVD device, and on this is formed an insulation film by using, for example, a sputtering device, and further formed a mask by using a resist film, etc., and this is etched into a striped shape by using hydrofluoric acid, etc.

The substrate 1 is made from, for example, sapphire (single crystal of $Al_2O_3$), and on this is formed a buffer layer 2 for alleviating the lattice unconformity between this and the semiconductor lamination section 12 by using, for example, GaN. With respect to the substrate 1, the above-mentioned conductive crystal substrate such as GaAs and Si having SiC formed on its surface and GaN may also be used. In accordance with the material of the substrate 1, the material of the buffer layer 2 is selected, and the thickness of the buffer layer 2 is set in the range of approximately 0.01 to 0.1 $\mu$m, in order to absorb the lattice unconformity. As described earlier, the application of the conductive substrate makes it possible to take the respective electrodes out from both of the upper and lower faces of the chip, and also to provide chips through cleavage. Thus, it becomes possible to provide the end face forming the light-releasing face as a mirror surface, and consequently to provide a semiconductor laser having a superior resonance characteristic.

The semiconductor lamination section 12, which is laminated in the same manner as the aforementioned embodiments, has a structure in which, on a light emitting layer forming portion 11 made from n-type GaN with a thickness of 1 to 2 $\mu$m with an n-type contact layer 3 located in between, an etching stop layer 27 is formed with a thickness of approximately 10 to 100 nm, and on this is formed a p-type contact layer 7 made from p-type GaN with a thickness of approximately 0.8 $\mu$m through a current constriction layer 17 having a stripe groove 18 formed therein. The etching stop layer 27 serves so as not to give damages to the p-type clad layer 6 upon etching the insulation film, and is also made as a film that contains the least amount of Al that is susceptible to oxidation so that even if, after having been taken out of the epitaxial growth device, it is exposed by etching, the surface is less susceptible to oxidation, and maintained in a clean state. For this reason, it is preferable to provide this layer as a GaN layer, or any layer may be used as long as it has a small mixed crystal ratio of Al; for example, $Al_sGa_{1-s}N$ ($0<s\leq 0.1$) may be used. The n-type and p-type contact layers 3 and 7 are layers used for providing ohmic contact to the respective n-side electrode 9 and p-side electrode 10, and the p-type contact layer 7 is formed by putting a wafer again into the MOCVD device, etc. after the current constriction layer 17 have been formed, and allowing a GaN layer to grow therein.

Since the current constriction layer 17 is an insulator, it is not possible to allow a semiconductor layer to grow thereon; however, a semiconductor layer is allowed to grow thereon while using the semiconductor layer exposed through the stripe groove 18 as seeds, and when this has grown to the height corresponding to the surface of the current constriction layer, since the rate of growth of GaN in the lateral direction is greater than that in the longitudinal direction, GaN starts to grow laterally in a manner so as to cover the surface of $SiO_2$ of the current constriction layer 17 (this is referred to as the lateral growth). The fact that GaN exhibits the lateral growth has been generally known, for example, from Japanese Journal of Applied Physics (Jpn. J. Appl. Phys.) part 2.36, on page 899 (1997), in which Ei, Usui, et al have disclosed the lateral growth that is used so as to reduce defects in crystals. In this embodiment, the current constriction layer 17, made from an insulator, is formed on a semiconductor layer, and the growth of the semiconductor layer through the stripe groove 18 is allowed to further proceed laterally over the surface of the insulator so that the p-type contact layer 7 is formed. Thus, the current constriction layer 17 made from the insulator is embedded into the semiconductor lamination section. As a result, although a current spreads entirely in the p-type contact layer 7, it is not allowed to flow through the insulator; thus, the p-type contact layer 7 is electrically connected to the p-type clad layer 6 side only through the stripe groove 18 which has been removed in a striped shape, and the current concentrates on this portion.

Here, in this example, the p-type contact layer 7 is allowed to grow over the current constriction layer 17; however, the growth of the p-type clad layer 6 may be stopped to approximately half of its thickness, and on this current constriction layer 17, a second p-type clad layer is allowed to grow, and on this, the contact layer 7 may be further allowed to grow. The other structures, such as the light emitting layer forming portion 11 and the electrode are the same as those described in the aforementioned embodiments; and the corresponding parts are indicated by the same reference numbers, and the description thereof is omitted.

With respect to the manufacturing method, the same manufacturing processes as those described in the aforementioned respective examples may be adopted; however, after the p-type clad layer 6 has grown, the wafer is taken out of the MOCVD device, and on this is formed an insulation film made from, for example, SiO$_2$ by, for example, the sputtering device. Then, a resist film is formed on this surface, and this is patterned by using a photolithographic technique to allow the insulation film to be exposed in a stripe shape, and the exposed portion of the insulation film is then etched by an acidic solution such as hydrofluoric acid and buffered hydrofluoric acid, thereby forming a current constriction layer 17 having a stripe groove 18 formed therein.

Thereafter, this is again put into the MOCVD device, and in the manner as described above, the p-type contact layer 7 made from GaN is allowed to grow. At this time, the semiconductor layer is not allowed to grow on the current constriction layer 17 that is an insulation film; however, as described above, the GaN layer is allowed to grow within the stripe groove 18 with the exposed portion of the etching stop layer 27 through the stripe groove 18 serving as seeds. When the growth has reached the surface of the current constriction layer 17, the lateral growth proceeds in the lateral direction on the surface of the current constriction layer 17, and the lateral growth successively progresses in the lateral direction as well as in the upward direction. As a result, a GaN layer has grown on the current constriction layer 17, thereby forming a p-type contact layer 7.

In accordance with the semiconductor laser of the seventh embodiment, since the current constriction layer made from an insulator is formed in the Group III nitride compound semiconductor lamination section; therefore, without carrying out etching on the Group III nitride compound semiconductor layer to which it is difficult to apply wet etching, the current constriction layer is formed close to the active layer. As a result, the distance between the current constriction layer and the active layer is shortened so that the current constriction layer is free from current flow except for the area corresponding to the stripe groove; therefore, it is possible to effectively inject a current to the active layer prior to the current diffusion. Thus, it becomes possible to increase the quantum efficiency while reducing the threshold value, and consequently achieve a high output and high reliability.

Moreover, in accordance with this method, the current constriction layer is formed by an insulator, and the lateral growth of the Group III nitride compound semiconductor is utilized so as to allow the semiconductor layer to grow on the current constriction layer; therefore, it is possible to easily form a stripe groove by using an etching solution such as hydrofluoric acid, and also to form the current constriction layer close to the active layer using a simple method.

FIG. 15 is an explanatory cross-sectional view showing a modified example of FIG. 14. In this example, in the same manner as the example shown in FIG. 1, the GaAs substrate 1 is used as the substrate of the LD chip so that it is possible to take the p-side and n-side electrodes out from both of the upper and lower faces of the chip, and also to provide cleavage; therefore, the structure and formation method of the current constriction layer 17 are the same as those shown in FIG. 14 and FIG. 1. The corresponding portions are indicated by the same reference numbers, and the description thereof is omitted.

With this structure, as described earlier, the current constriction layer is formed in the vicinity of the active layer while using the Group III nitride compound semiconductor, and the n-side electrode 9 can be formed without the necessity of etching one portion of the laminated semiconductor layer; thus, a vertical-type chip that allows both of the electrodes to be taken out from both of the upper and lower faces of the chip, and the structure from the substrate to the semiconductor lamination section 12 is allowed to have a lamination structure of the cubic crystal type, thereby making it possible to provide cleavage. As a result, it is possible to increase the quantum efficiency while reducing the threshold value, and consequently to achieve a high output and high reliability. Moreover, it is possible to easily carry out the chip bonding process, and also to obtain a very flat face as the end face of the resonator serving as the light-releasing face; thus, it becomes possible to provide a semiconductor laser having a superior resonance property.

FIG. 16 is a drawing that shows still another modified example of FIG. 14. In this example, as the substrate 1, in the same manner as the example of FIG. 4, an Si substrate is utilized. As described earlier, the SiC layer is used as the buffer layer 2. The structures thereof are the same as those shown in FIG. 4; therefore, the description thereof is omitted. In this example also, in the same manner as the example of FIG. 15, it is possible to obtain a semiconductor laser having a superior resonance property.

n addition to the above-mentioned example, the application of a GaN substrate as the substrate makes it possible to laminate the Group III nitride compound semiconductor layer without causing any lattice unconformity between this and the Group III nitride compound semiconductor layer. Here, in this case also, it is preferable to form the buffer layer made from GaN prior to the start of the growth of the semiconductor layer, in order to allow the buffer layer to be conformed to the semiconductor layer.

In accordance with the seventh embodiment, the current constriction layer that allows the stripe groove to be easily etched is formed while using the Group III nitride compound semiconductor. Thus, it is possible to positively inject a current into the current injection area, and consequently to increase the quantum efficiency while reducing the threshold value. As a result, it becomes possible to achieve a semiconductor laser which has a high output and high reliability.

Moreover, the application of GaAs, Si, GaN, etc. as the substrate makes it possible to provide a chip of the vertical type that exhibits cleavage; therefore, it is possible to obtain a laser resonator having a superior end face, and also to obtain a semiconductor laser having high performances with a short wavelength.

Figure 17:
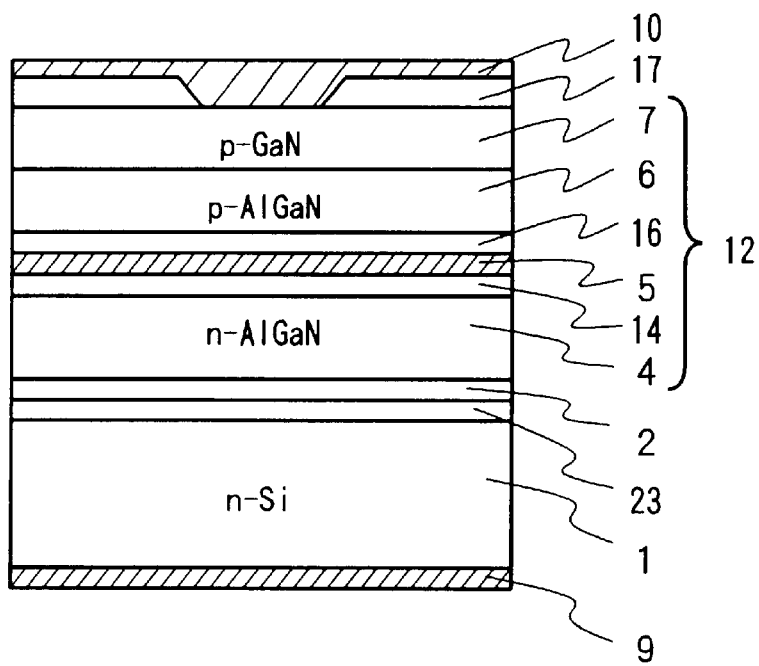
FIG. 17 is an explanatory drawing that shows an eighth embodiment.
Figure 18:
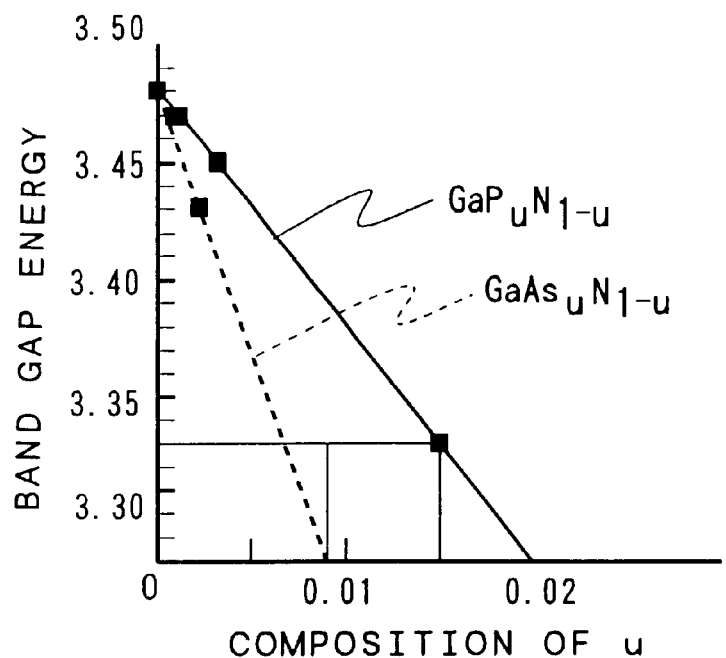
FIG. 18 is a drawing that shows the change in band gap caused by the mixed crystal rate u in $GaP_uN_{1-u}$.

FIGS. 17 and 18 are drawings that show an eighth embodiment which improves the light emitting efficiency of a light emitting device made from a Group III nitride compound semiconductor. As described earlier, the Group III nitride compound semiconductor is stable thermally as well as chemically, and very advantageous in its high reliability and long service life. However, because of its stableness, the growth thereof needs to be always carried out at an extremely high temperature of approximately 1000° C. in order to obtain a semiconductor layer having a superior crystalline property, as described, for example, in Patent Publication No. 2713094. Here, since the semiconductor layer containing In, such as the active layer, has a difficulty in providing a mixed crystal of elements In and GaN, and since In requires a high vapor pressure, the crystal growth is only available at a temperature of approximately 700° C. or less in order to contain sufficient In. For this reason, it is difficult to obtain a semiconductor layer having a superior crystal line property, resulting in a reduction in the light emitting efficiency and degradation in the service life. In particular, in an attempt to obtain light emissions in wavelengths longer than that of blue close to green, the amount of In needs to be increased. However, as the amount of In increases, the crystalline property deteriorates; therefore, it is impossible to increase the ratio of In in the mixed crystal.

Japanese Unexamined Patent Application No. 37355/1994 (Tokukaihei 6-37355) discloses a method in which a material of GaAsN type is applied to an active layer in order to achieve a semiconductor light emitting device which can emit light in a wide wavelength range by using one kind of a compound semiconductor. In other words, this reference discloses that, since GaP is a semiconductor of an indirect transition type, a GaAsN type material having a band structure of a direct type is applied thereto so that it is possible to cover a wide wavelength range. However, the GaAsN type material has a bowing characteristic in which, with respect to the ratio of As in the mixed crystal, the band gap energy varies not linearly, but with the square thereof; therefore, in particular in ranges from blue to the vicinity of green, a slight variation in the ratio of As in the mixed crystal causes a great variation in the band gap energy, making it difficult to achieve a target light emitting wavelength.

Referring to FIG. 17 which shows an explanatory cross-sectional view of one example thereof, the semiconductor light emitting device of the eighth embodiment is provided with an active layer 5 that is made from a Group III nitride compound semiconductor and that emits light by a current injection, and an n-type clad layer 4 and a p-type clad layer 6 that are made from a Group III nitride compound semiconductor having a band-gap energy greater than the active layer 5 and that sandwiches the active layer from both of the faces thereof. Here, the active layer 5 is made of a compound semiconductor layer containing Ga, P and N, for example, $GaP_uN_{1-u}$ (0<u<0.5).

The active layer 5, which emits light by utilizing re-coupling of carriers and has its band gap energy that determines the wavelength of light to be emitted, is made from a material having a band gap energy suitable for the wavelength of light to be emitted, and has a multiple quantum well structure (MQW) having laminated layers of 3 to 5 well layers, each made from $GaP_{0.1}N_{0.9}$, and laminated layers of 3 to 5 barrier layers, each made from $GaP_{0.02}N_{0.98}$, the total thickness of laminated layers being set to approximately 10 to 100 nm. The present invention is characterized in that the active layer 5 is made from a compound semiconductor, such as $GaP_uN_{1-u}$ (0<u<0.5), that is different from the InGaN type compound semiconductor (in which "type" means that the ratio of In in the mixed crystal is variably changed so as to have a desired band gap energy, and the same is true in the following description).

In other words, as described earlier, with respect to the blue-color semiconductor light emitting device for emitting light by sandwiching a conventional active layer with clad layers having band gap energy greater than that of the active layer, a Group III nitride compound semiconductor is used with a InGaN type compound semiconductor being used as the active layer; however, as described earlier, the InGaN type compound semiconductor is inferior in its crystalline property, and fails to increase the ratio of In in the mixed crystal beyond a given value, resulting in a failure to obtain light emission having a long wavelength exceeding a certain degree. For this reason, the inventors of the present invention have studied hard, and found that the application of a mixed crystal between GaN and GaP makes it possible to provide a superior crystalline property and consequently to reduce the band gap energy.

Referring to FIG. 18 that shows a graph of the band gap energy (eV) with respect to one portion of the ratio of u in the mixed crystal, although the change does not take place linearly as a whole in $GaP_uN_{i-u}$, the band gap energy decreases as the value of u increases, and by properly selecting the ratio of P in the mixed crystal, it is possible to obtain an active layer having desired band gap energy. For example, in order to emit light having a wavelength in the range of approximately 400 to 430 nm, the value of u is preferably set in the range of 0.05 to 0.2. As described earlier, the change in the band gap energy with respect to u in $GaP_uN_{1-u}$ is not linear as a whole (in FIG. 18, it appears to be linear because of the narrow range of u); however, in the case when the ratio As in the mixed crystal of GaAsN type is changed, the rate of change is by far smaller than that of the GaAsN type, as indicated by a broken line in FIG. 18. In other words, the bowing parameter of the band gap energy is as small as 9.31 eV in GaN—GaP in comparison with 19.6 eV in GaN—GaAs, for example, as described on pages 14.36 to 1439, vol. 37 in Japanese Journal of Applied Physics (Jpn. J. Appl. Phys.) published in 1998.

In order to avoid the formation of a non-light emitting re-coupling,center, it is preferable to use a non-doped material as the active layer 5. Here, in order to obtain such a solid solution, for example, triethyl gallium (TEG), phosphine ($PH_3$) and ammonia ($NH_3$), which are reaction gases of Ga, P and N, are introduced together with hydrogen ($H_2$) serving as a carrier gas, by using, for example, the MOCVD method, and while the flow rate is being adjusted, this is allowed to react at a temperature in the range of 600 to 900° C. to obtain a solid solution having a desired mixed crystal ratio.

The structures of the substrate 1, the semiconductor lamination section 12 and the electrodes other than the active layer 5 are the same as those shown in FIG. 4, and the same manufacturing method may be adopted; therefore, the corresponding portions are indicated by the same reference numbers, and the description thereof is omitted. In this example, an insulation film serving as the current constriction layer 17, which is made from $SiO_2$, etc. and has a stripe groove having a width of, for example, 5 to 10 μm formed therein, is formed on a p-type contact layer 7 with a thickness of 0.1 to 0.6 μm by the CVD method, and on this is formed a p-side electrode 10.

In accordance with the eighth embodiment, the active layer is made from, not an InGaN type compound semiconductor, but a GaPN type compound semiconductor so that the active layer can also be laminated at a high temperature, thereby making it possible to obtain an active layer having a superior crystalline property. As a result, it is possible to achieve light emission with high efficiency with a small threshold value even in the case of a non-doped composition. Here, as described earlier, although no linear characteristic exists between the ratio of P in the mixed crystal and the band gap, the rate of change is small up to a ratio of the mixed crystal of approximately 0.2, and no problem is therefore raised in light emissions from blue color to approximately green color.

In the above-mentioned example, the current injection area is determined by installing an insulation film beneath the p-side electrode 10; however, in the same manner as the embodiments as described above, other structures, such as LD chips of an electrode stripe structure in which the p-side electrode is made to have a stripe shape, a mesa-stripe structure in which semiconductor layers on both of the sides of the striped electrode are etched to the upper portion of the p-type clad layer in a mesa-shape or a proton injecting type in which protons, etc. are injected thereto, may be adopted. Moreover, another structure in which a current constriction layer is embedded therein may be adopted. Furthermore, the substrate 1 may have a structure shown in FIG. 1 or FIG. 3.

Moreover, in the above-mentioned example, a semiconductor laser has been discussed; however, with respect to light emitting diodes (LEDs), it is possible to obtain a LED chip which has a superior crystalline property with high light emitting efficiency can be obtained in the same manner. In this case, it is not necessary for the LED to confine light so that no light guide layer is required, and the active layer is formed in the single quantum well structure or the double hetero-junction structure. Furthermore, in the case of the LED, not limited to the double hetero-junction structure, a GaPN type compound semiconductor may be applied to one of the semiconductors forming the pn-junction.

In accordance with the eighth embodiment, since a compound semiconductor layer having a superior crystalline property is used as the active layer of the semiconductor light emitting device using a Group III nitride compound semiconductor, it is possible to provide a semiconductor light emitting device having an improved light emitting efficiency and superior reliability.

In the above-mentioned example in the eighth embodiment, the compound semiconductor layer having an active layer containing Ga, P and N is used; however, in place of this, a compound semiconductor layer containing Tl and Ga may be used. As described earlier, it has been known that, with respect to the InGaN type compound semiconductor, as the ratio of In in the mixed crystal becomes greater, its crystalline property greatly deteriorates, and in general, the ratio of In in the mixed crystal is preferably set to not more than 0.2. For this reason, in the InGaN type compound semiconductor, it is difficult to set the band gap energy to not more than 2.9 eV, and it is therefore difficult to emit light having a wavelength of not less than 430 nm.

Japanese Unexamined Patent Application No. 274370/1996 (Tokukaihei 8-274370) discloses a method in which: thallium (Tl) atoms are applied to a III-type nitride compound semiconductor as a dopant having one valence electron, and when this is added to an active layer of an InGaN type compound, the Tl atom forms a re-coupling center of D-A (donor/acceptor) light emission, thereby making it possible to form a green-color LED with high luminance. However, impurities in an active layer also serve as non-light-emission re-coupling centers, and cause heat generation; therefore, in order to realize the continuous oscillation of the semiconductor laser at room temperature, it is necessary to provide light emission with higher efficiency. In other words, as also described in this patent reference, since it is impossible to prevent the reduction in the crystalline property at the time of addition of impurities exceeding a predetermine amount, there is a reduction in the efficiency of laser light emission when Tl is used as a mono-valent dopant. For this reason, it has not been reported that a green-color laser made from a Group III nitride compound semiconductor capable of providing continuous oscillation at room temperature has been achieved.

Moreover, Japanese Unexamined Patent Application No. 219561/1997 (Tokukaihei 9-219561) discloses a method in which, in order to prevent waveform variations depending on temperatures in wavelength bands from 1.3 to 1.65 $\mu$m that are applied to optical communication, Tl is further mixed to a mixed crystal semiconductor such as GaInAsP or AlInAs so as to form an active layer. This also discloses that the band gap energy is varied depending on the ratio of Tl in the mixed crystal; however, the structure disclosed here aims to prevent the oscillation wavelength in the range of 1.2 to 1.65 $\mu$m from varying depending on temperatures, and only takes it into consideration the band gap energy of approximately 2 eV related to GaP and AlAs. In other words, this does not disclose anything about the green-color light emission by using a mixed crystal of Tl.

The inventors of the present invention have studied hard so as to achieve a narrow band gap while using a Group III nitride compound semiconductor, and as a result, found that by using a mixed crystal of GaN phase and TlN phase, it is possible to obtain a mixed crystal having a superior crystalline property, and also to narrow the band gap energy, thereby achieving a semiconductor laser of green color (having a wavelength of approximately 500 to 550 nm).

In other words, the semiconductor light emitting device having an active layer containing Tl and Ga can be achieved by using the same structure as that of FIG. 17, and is provided with an active layer 5 which is made from a Group III nitride compound semiconductor and emits light upon receipt of a current injection, and an n-type clad layer 4 and a p-type clad layer 6, made from a Group III nitride compound semiconductor having a band gap greater than the active layer 5, which sandwich the active layer 5 from the respective sides, and the active layer 5 is made of a compound semiconductor layer containing at least Tl and Ga, for example, represented by $Tl_vGa_{1-v}N$ (0<v<1).

The active layer 5, which emits light by utilizing re-coupling of carriers and has its band gap energy that determines the wavelength of light to be emitted, is made from a material having a band gap energy suitable for the wavelength of light to be emitted, and has a multiple quantum well structure (MQW) having laminated layers of 3 to 5 well layers, each made from $Tl_{0.1}Ga_{0.9}N$, and laminated layers of 3 to 5 barrier layers, each made from $Tl_{0.02}Ga_{0.98}N$, the total thickness of laminated layers being set to approximately 5 to 10 nm. The present invention is characterized in that the active layer 5 is made from a compound semiconductor, such as $Tl_vGa_{1-v}N$ (0<v<1), that is different from the InGaN type compound semiconductor.

In other words, as described earlier, with respect to the blue-color semiconductor light emitting device for emitting light by sandwiching a conventional active layer with clad layers having band gap energy greater than that of the active layer, a nitride compound semiconductor is used with a InGaN type compound semiconductor being used as the active layer; however, as described earlier, the InGaN type compound semiconductor is inferior in its crystalline property, and fails to increase the ratio of In in the mixed crystal beyond a given value, resulting in a failure to obtain light emission having a long wavelength exceeding a certain degree. For this reason, the inventors of the present invention have studied hard in order to narrow the band gap while using a Group III nitride compound semiconductor, and found that, as described above, the application of a mixed crystal between GaN phase and TlN phase makes it possible to provide a superior crystalline property, to reduce the band gap energy and consequently to achieve a green color semiconductor laser.

The solid solution of the mixed crystal of the GaN phase and TlN phase is different from the case using Tl as a dopant in the bonding method between Ga and Tl, and makes it possible to reduce the band gap energy without causing adverse effects to the crystalline property. The solid solution of the GaN phase and the TlN phase is changed in its ratio of the mixed crystal freely, and as the ratio of Tl of the mixed crystal increases, the band gap energy decreases. For example, in order to emit green light (wavelengths of approximately 500 to 550 nm), the ratio v of Tl of the mixed crystal is preferably set to approximately 0.3 to 0.6 so that desired band gap energy is obtained. Here, in order to obtain such a solid solution, for example, trimethyl thallium (TMTl), triethyl gallium (TEG), and ammonia ($NH_3$), which are reaction gases of Tl, Ga and N, are introduced together with hydrogen ($H_2$) serving as a carrier gas, by using, for example, the MOCVD method, and while the flow rate is being adjusted, this is allowed to react at a temperature in the range of 600 to 800° C. to obtain a solid solution having a desired mixed crystal ratio. With respect to the reaction gas of Tl, the application of such a trivalent organic metal compound makes it possible to provide a mixed crystal with GaN that is not allowed to form a dopant. This is because Ga has three outermost electrons, and the trivalent Tl is allowed to enter as a constituent element of the crystal in place of Ga. For example, when a monovalent cyclopentadienyl thallium ($GP_2Tl$) is used, this forms a dopant, failing to obtain a mixed crystal; this causes a reduction in the crystalline property and a failure to provide light emission with a high output suitable for a semiconductor laser, as described earlier. Examples of such trivalent Tl compounds include triethyl thallium, etc.

The other structures and manufacturing methods are the same as those described earlier; therefore, the description thereof is omitted. Moreover, any of the aforementioned structures may be adopted. Moreover, in the case of the LED, not limited to the double hetero-junction structure, a TlGaN type compound semiconductor may be applied to one of the semiconductors forming the pn-junction.

In this example, instead of the InGaN type compound semiconductor, the TlGaN type compound semiconductor is used as the active layer so that the Group III nitride compound semiconductor layer can be laminated even at high temperatures to obtain an active layer having a superior crystalline property. Moreover, the band gap energy is reduced so that green-color light emission is available. As a result, even in the case of a non-doped structure, the threshold value can be reduced so that light having wavelengths of green color, etc. can be emitted with high efficiency. Thus, it becomes possible to obtain a laser oscillation of green color. Consequently, it becomes possible to achieve a semiconductor laser having wavelengths of green color, etc., that are longer wavelengths than blue color, and also to provide a semiconductor light emitting device having improved light emitting efficiency and superior reliability.

In the drawings shown in the above-mentioned respective examples, the thickness of each of the substrates is actually several tens times as thick as the other layers; however, this is drawn in a thinner manner as a conceptual drawing. The thickness of each of the other semiconductor layers is also given as a conceptual drawing, and does not represent an actual thickness.

INDUSTRIAL APPLICABILITY

In accordance with the present invention, it is possible to provide a blue-color semiconductor light emitting device using a Group III nitride compound semiconductor of a so-called vertical type, which allows both of electrodes to be taken out from both of the upper and lower sides of a chip, with superior properties. Therefore, the semiconductor light emitting device is suitably applied to a light source for devices such as optical disk memories having high recording density and laser beam printers.

What is claimed is:

1. A semiconductor light emitting device comprising:
    an active layer made from a Group III nitride compound semiconductor, and
    n-type and p-type clad layers, made from a Group III nitride compound semiconductor having band gap energy greater than said active layer, which sandwich said active layer from the respective sides,
    wherein said active layer is a compound semiconductor layer made of a material represented by a general formula, $Tl_vGa_{1-v}N$ (0<v<1).

2. The semiconductor light emitting device of claim 1, wherein said active layer has a quantum well structure, and a well layer of said quantum well structure is made of a material represented by a general formula, $Tl_vGa_{1-v}N$ (0<v<1).

* * * * *